(12) United States Patent
Mochizuki

(10) Patent No.: US 11,635,296 B2
(45) Date of Patent: Apr. 25, 2023

(54) MAGNETIC SENSOR DEVICE, METHOD OF MANUFACTURING THE SENSOR DEVICE, AND ROTATIONAL OPERATION MECHANISM

(71) Applicant: TDK Corporation, Tokyo (JP)

(72) Inventor: Shinichirou Mochizuki, Tokyo (JP)

(73) Assignee: TDK Corporation, Tokyo (JP)

( * ) Notice: Subject to any disclaimer, the term of this patent is extended or adjusted under 35 U.S.C. 154(b) by 264 days.

(21) Appl. No.: 17/128,018

(22) Filed: Dec. 19, 2020

(65) Prior Publication Data

US 2021/0293538 A1    Sep. 23, 2021

(30) Foreign Application Priority Data

Mar. 19, 2020  (JP) .............................. JP2020-049897

(51) Int. Cl.
   *G01C 9/06*   (2006.01)
(52) U.S. Cl.
   CPC ....................................... *G01C 9/06* (2013.01)
(58) Field of Classification Search
   CPC ........................................................ G01C 9/06
   See application file for complete search history.

(56) References Cited

U.S. PATENT DOCUMENTS 7,197,343 B2 *  3/2007  Sato .......................... H04M 1/21
                                                    33/315
9,797,721 B2 *  10/2017  Deak .................. G01R 33/0005
2010/0117638 A1 *  5/2010  Yamashita .......... G01R 33/0206
                                                    324/233
2014/0266187 A1   9/2014  Mather
2015/0285873 A1   10/2015  Cai et al.
2016/0327391 A1   11/2016  Saito
2020/0271474 A1 *  8/2020  Nozawa .................. G04G 21/02

FOREIGN PATENT DOCUMENTS

| JP | 2004-12156 A | 1/2004 |
| JP | 2005-172527 A | 6/2005 |
| JP | 2008-286739 A | 11/2008 |
| JP | 2015-532429 A | 11/2015 |
| WO | 2015/111534 A1 | 7/2015 |

* cited by examiner

*Primary Examiner* — Elias Desta
(74) *Attorney, Agent, or Firm* — Posz Law Group, PLC

(57) ABSTRACT

A magnetic sensor device includes first and second surfaces, and first and second inclined surfaces, which are inclined with respect to the first surface; first through third magnetic sensor units for detecting magnetism in first through third axial directions; and a signal processing unit that performs signal processing on the basis of first through third sensor signals output from the first through third magnetic sensor units. The first axial direction is a direction orthogonal to the first surface, and the second and third axial directions are directions orthogonal to each other on the first surface. The first and second magnetic sensor units are provided on the second inclined surface, respectively. A corrected signal generation unit included in the signal processing unit generates first and second corrected signals, which are the first and second sensor signals corrected in accordance with the inclination angles of the first and second inclined surfaces.

13 Claims, 12 Drawing Sheets

MAGNETIC SENSOR DEVICE, METHOD OF MANUFACTURING THE SENSOR DEVICE, AND ROTATIONAL OPERATION MECHANISM

CROSS REFERENCE TO RELATED APPLICATION

This application is based on and claims priority to Japanese Patent Application No. 2020-049897 filed on Mar. 19, 2020, the disclosure of which is incorporated herein by reference.

TECHNICAL FIELD

The present invention relates to a magnetic sensor device, a method of manufacturing the magnetic sensor device, and a rotational operation mechanism that uses the magnetic sensor device.

BACKGROUND

In the past, to control operation of a joint such as an arm or the like of an industrial robot or the like, a magnetic sensor device has been used that is capable of detecting changes in a magnetic field caused by operation of the joint. As a magnetic sensor device 1' used in order to detect the magnetic field components in the three mutually orthogonal axial directions (X-axis, Y-axis and Z-axis) used in the joint of the arm or the like of this kind of industrial robot or the like, one is known that has three magnetic sensor elements, namely, an X-axis magnetic sensor element 31' provided on a top surface 21' of a substrate 2', a Y-axis magnetic sensor element 32' provided on a first inclined surface 23' formed on the top surface 21' side of the substrate 2', and a Z-axis magnetic sensor element 33' provided on a second inclined surface 24' formed on the top surface 21' side of the substrate 2', as shown in FIG. 15.

In this kind of magnetic sensor device 1', the X-axis magnetic sensor element 31' is provided to detect a magnetic field component HX in the X-direction, which is parallel to the top surface 21' of the substrate 2', the Y-axis magnetic sensor element 32' is provided to detect a magnetic field component HY in the Y-direction, which is parallel to the top surface 21' of the substrate 2' and orthogonal to the X-direction, and a Z-axis magnetic sensor element 33' is provided to detect a magnetic field component HZ in the Z-direction, which is orthogonal to the top surface 21' of substrate 2'. However, the Y-axis magnetic sensor element 32' provided on the first inclined surface 23' of the substrate 2' outputs a signal SY' corresponding to a magnetic field component HY' in a Y'-axis direction, which is inclined with respect to the Y-axis by the inclination angle θ of the first inclined surface 23', and the Z-axis magnetic sensor element 33' provided on the second inclined surface 24' of the substrate 2' outputs a signal SZ' corresponding to a magnetic field component HZ' of a Z'-axis direction, which is inclined with respect to the Z-axis by the inclination angle θ of the second inclined surface 24'. Consequently, the magnetic sensor deice 1' is provided with a coordinate system conversion unit that converts the signal SY' corresponding to the magnetic field component HY' in the Y'-axis direction output from the Y-axis magnetic sensor element 32' into a signal SY corresponding to the magnetic field component HY in the Y-direction through geometric calculations and converts the signal SZ' corresponding to the magnetic field component HZ' in the Z'-axis direction output from the Z-axis magnetic sensor element 33' into a signal SZ corresponding to the magnetic field component HZ in the Z-direction through geometric calculations. Through this, the magnetic sensor device 1' can detect the magnetic field components in the mutually orthogonal X-axis, Y-axis and Z-axis directions.

PATENT LITERATURE 1 JP Laid-Open Patent Application No. 2004-12156

In the magnetic sensor device shown in FIG. 15, the coordinate system conversion unit converts the signal SY' corresponding to the magnetic field component HY' in the Y'-axis direction and the signal SZ' corresponding to the magnetic field component HZ' in the Z'-axis direction into the signal SY corresponding to the magnetic field component HY in the Y-direction and the signal SZ corresponding to the magnetic field component HZ in the Z-direction through the below equations, using the design angle of the inclination angle θ of the first inclined surface 23' and the second inclined surface 24'.

$$SY=(SY'-SZ')/2 \cos \theta$$

$$SZ=(SY'+SZ')/2 \sin \theta$$

The first inclined surface 23' and the second inclined surface 24' are formed by etching or the like of the top surface 21' of the substrate 2'. Consequently, the inclination angle θ of the first inclined surface 23' and the second inclined surface 24' varies with respect to the design angle thereof. As a result, variation arises in the signal SY corresponding to the magnetic field component HY in the Y-direction and the signal SZ corresponding to the magnetic field component HZ in the Z-direction converted by the coordinate system conversion unit, creating the problem that the magnetic field detection accuracy of the magnetic sensor device 1' is caused to decline.

SUMMARY

In consideration of the foregoing, it is an object of the present invention to provide a magnetic sensor device capable of highly accurate detection of a magnetic field in three axial directions, a method of manufacturing the magnetic sensor device, and a rotational operation mechanism.

To resolve the above-described problem, the present invention provides a magnetic sensor device including: a first surface and a second surface, which is positioned opposite to the first surface, and a first inclined surface and second inclined surface, which are inclined with respect to the first surface; a first magnetic sensor unit for detecting magnetism in a first axial direction; a second magnetic sensor unit for detecting magnetism in a second axial direction; a third magnetic sensor unit for detecting magnetism in a third axial direction; and a signal processing unit that performs signal processing on the basis of a first sensor signal $S_1$ output from the first magnetic sensor unit, a second sensor signal $S_2$ output from the second magnetic sensor unit and a third sensor signal $S_3$ output from the third magnetic sensor unit. The first axial direction is a direction orthogonal to the first surface; the second axial direction and the third axial direction are directions orthogonal to each other on the first surface. The first magnetic sensor unit is provided on the first inclined surface. The second magnetic sensor unit is provided on the second inclined surface. The signal processing unit includes a corrected signal generation unit that generates a first corrected signal $S_{C1}$ and a second corrected signal $S_{C2}$, which are the first sensor signal $S_1$ and the second sensor signal $S_2$ corrected in accordance with the inclination angle $\theta_1$ of the first inclined surface and the inclination angle $\theta_2$ of the second inclined surface.

The corrected signal generation unit generates the first corrected signal $S_{C1}$ by correcting the first sensor signal $S_1$ using Equation (1) below and generates the second corrected signal $S_{C2}$ by correcting the second sensor signal $S_2$ using Equation (2) below.

Formula 1

$$S_{C1} = \frac{\sin\theta_2 \cdot S_1 + \sin\theta_1 \cdot S_2}{\sin(\theta_1 + \theta_2)} \quad (1)$$

Formula 2

$$S_{C2} = \frac{\cos\theta_2 \cdot S_1 + \cos\theta_1 \cdot S_2}{\sin(\theta_1 + \theta_2)} \quad (2)$$

In Equation (1) and Equation (2) above, $S_{C1}$ indicates the first corrected signal, $S_{C2}$ indicates the second corrected signal, $S_1$ indicates the first sensor signal, $S_2$ indicates the second sensor signal, $\theta_1$ indicates the inclination angle of the first inclined surface, and $\theta_2$ indicates the inclination angle of the second inclined surface.

The inclination angle $\theta_1$ of the first inclined surface is an angle calculated from Equation (3) below using a signal $S_{1\text{-}11}$ output from the first magnetic sensor unit when a first magnetic field $H_{11}$ in the first axial direction is applied to the magnetic sensor device, a signal $S_{1\text{-}12}$ output from the first magnetic sensor unit when a second magnetic field $H_{12}$ in the first axial direction is applied to the magnetic sensor device, a signal $S_{1\text{-}21}$ output from the first magnetic sensor unit when a first magnetic field $H_{21}$ in the second axial direction is applied to the magnetic sensor device, and a signal $S_{1\text{-}22}$ output from the first magnetic sensor unit when a second magnetic field $H_{22}$ in the second axial direction is applied to the magnetic sensor device; the inclination angle $\theta_2$ of the second inclined surface is an angle calculated from Equation (4) below using a signal $S_{2\text{-}11}$ output from the second magnetic sensor unit when the first magnetic field $H_{11}$ in the first axial direction is applied to the magnetic sensor device, a signal $S_{2\text{-}12}$ output from the second magnetic sensor unit when the second magnetic field $H_{12}$ in the first axial direction is applied to the magnetic sensor device, a signal $S_{2\text{-}21}$ output from the second magnetic sensor unit when the first magnetic field $H_{21}$ in the second axial direction is applied to the magnetic sensor device, and a signal $S_{2\text{-}22}$ output from the second magnetic sensor unit when the second magnetic field $H_{22}$ in the second axial direction is applied to the magnetic sensor device; the first magnetic field $H_{11}$ in the first axial direction and the second magnetic field $H_{12}$ in the first axial direction have different magnetic field strengths from each other; and the first magnetic field $H_{21}$ in the second axial direction and the second magnetic field $H_{22}$ in the second axial direction can have different magnetic field strengths from each other.

Formula 3

$$\theta_1 = \operatorname{atan}\left(\frac{|S_{1\text{-}22} - S_{1\text{-}21}|}{|S_{1\text{-}12} - S_{1\text{-}11}|}\right) \quad (3)$$

Formula 4

$$\theta_2 = \operatorname{atan}\left(\frac{|S_{2\text{-}22} - S_{2\text{-}21}|}{|S_{2\text{-}12} - S_{2\text{-}11}|}\right) \quad (4)$$

The signal processing unit further includes a memory unit that stores a correction coefficient F indicated in Matrix Equation (5) below for generating the first corrected signal $S_{C1}$ and the second corrected signal $S_{C2}$ by correcting the first sensor signal $S_1$ and the second sensor signal $S_2$; and the corrected signal generation unit generates the first corrected signal $S_{C1}$ and the second corrected signal $S_{C2}$ by correcting the first sensor signal $S_1$ and the second sensor signal $S_2$ using Matrix Equation (7) below.

Formula 5

$$F = \begin{bmatrix} \cos\theta_1 & \sin\theta_1 \\ \cos\theta_2 & -\sin\theta_2 \end{bmatrix} \quad (5)$$

Formula 6

$$\begin{bmatrix} S_{C1} \\ S_{C2} \end{bmatrix} = F^{-1} \times \begin{bmatrix} S_1 \\ S_2 \end{bmatrix} \quad (7)$$

In Matrix Equation (5) above, F indicates the correction coefficient, $\theta_1$ indicates the inclination angle of the first inclined surface and $\theta_2$ indicates the inclination angle of the second inclined surface, and in Matrix Equation (7) above, $S_{C1}$ indicates the first corrected signal, $S_{C2}$ indicates the second corrected signal, $S_1$ indicates the first sensor signal, $S_2$ indicates the second sensor signal, and $F^{-1}$ indicates the inverse matrix of F.

The first magnetic sensor unit can include a first magnetoresistive effect element, the second magnetic sensor unit can include a second magnetoresistive effect element, and the third magnetic sensor unit can include a third magnetoresistive effect element. The first through third magnetoresistive effect elements can be GMR elements or TMR elements. The magnetic sensor device can further include: a base, which has a first surface, a second surface, a first inclined surface and a second inclined surface; and a sealing part that integrally seals the base, the first through third magnetic sensor units, and the signal processing unit.

The present invention provides a rotational operation mechanism including a first member and a second member that rotate relative to each other, and the above-described magnetic sensor device, and the magnetic sensor device is provided in the first member to be integrally rotatable with the first member.

The above-described rotational operation mechanism further includes a magnetic field generation unit, and the magnetic field generation unit can be provided in the second member to be integrally rotatable with the second member.

The present invention provides a method of manufacturing a magnetic sensor device, wherein the magnetic sensor device includes a base having a first surface and a second surface, which is positioned on the side opposite the first surface and a first inclined surface and second inclined surface, which are inclined with respect to the first surface; a first magnetic sensor unit for detecting magnetism in a first axial direction; a second magnetic sensor unit for detecting magnetism in a second axial direction; a third magnetic sensor unit for detecting magnetism in a third axial direction; and a signal processing unit that performs signal processing on the basis of a first sensor signal $S_1$ output from the first magnetic sensor unit, a second sensor signal $S_2$ output from the second magnetic sensor unit, and a third sensor signal $S_3$ output from the third magnetic sensor unit. The first axial direction is a direction orthogonal to the first surface, and the second axial direction and the third axial direction are directions orthogonal to each other on the first surface. The first magnetic sensor unit is provided on the first inclined surface, and the second magnetic sensor unit is provided on the second inclined surface. The signal processing unit includes a corrected signal generation unit that generates a first corrected signal $S_{C1}$ and a second corrected signal $S_{C2}$ in which the first sensor signal $S_1$ and the second sensor signal $S_2$ are corrected in accordance with the inclination angle $\theta_1$ of the first inclined surface and the inclination angle $\theta_2$ of the second inclined surface. The method of manufacturing the magnetic sensor device includes: a first step for preparing the base; a second step for respectively providing the first magnetic sensor unit and the second magnetic sensor unit on the first inclined surface and the second inclined surface, respectively, of the base; a third step for finding the inclination angle $\theta_1$ of the first inclined surface and the inclination angle $\theta_2$ of the second inclined surface; and a fourth step for finding the correction coefficient for generating a first corrected signal $S_{C1}$ and a second corrected signal $S_{C2}$, in which the first sensor signal $S_1$ and the second sensor signal $S_2$ are corrected in accordance with the inclination angle $\theta_1$ of the first inclined surface and the inclination angle $\theta_2$ of the second inclined surface.

In the fourth step, the correction coefficient can be found using Matrix Equation (5) below.

Formula 7

$$F = \begin{bmatrix} \cos\theta_1 & \sin\theta_1 \\ \cos\theta_2 & -\sin\theta_2 \end{bmatrix} \quad (5)$$

In Matrix Equation (5) above, F indicates the correction coefficient.

The signal processing unit may further include a memory unit that stores the correction coefficient; and the method of manufacturing the magnetic sensor device can further include a fifth step of storing the correction coefficient calculated in the fourth step in the memory unit.

The third step can include: a step for applying a first magnetic field $H_{11}$ and a second magnetic field $H_{12}$ in the first axial direction and for applying a first magnetic field $H_{21}$ and a second magnetic field $H_{22}$ in the second axial direction respectively, to the first magnetic sensor unit provided on the first inclined surface in the second step; a step for applying the first magnetic field $H_{11}$ and the second magnetic field $H_{12}$ in the first axial direction and for applying the first magnetic field $H_{21}$ and the second magnetic field $H_{22}$ in the second axial direction, respectively, to the second magnetic sensor unit provided on the second inclined surface in the second step; a step for calculating the inclination angle $\theta_1$ of the first inclined surface through Equation (3) below, using a signal $S_{1-11}$ output from the first magnetic sensor unit by applying the first magnetic field $H_{11}$ in the first axial direction, a signal $S_{1-12}$ output from the first magnetic sensor unit by applying the second magnetic field $H_{12}$ in the first axial direction, a signal $S_{1-21}$ output from the first magnetic sensor unit by applying the first magnetic field $H_{21}$ in the second axial direction, and a signal $S_{1-22}$ output from the first magnetic sensor unit by applying the second magnetic field $H_{22}$ in the second axial direction; and a step for calculating the inclination angle $\theta_2$ of the second inclined surface through Equation (4) below, using a signal $S_{2-11}$ output from the second magnetic sensor unit by applying the first magnetic field $H_{11}$ in the first axial direction, a signal $S_{2-12}$ output from the second magnetic sensor unit by applying the second magnetic field $H_{12}$ in the first axial direction, a signal $S_{2-21}$ output from the second magnetic sensor unit by applying the first magnetic field $H_{21}$ in the second axial direction, and a signal $S_{2-22}$ output from the second magnetic sensor unit by applying the second magnetic field $H_{22}$ in the second axial direction. The first magnetic field $H_{11}$ in the first axial direction and the second magnetic field $H_{12}$ in the first axial direction have magnetic field strengths differing from each other, and the first magnetic field $H_{21}$ in the second axial direction and the second magnetic field $H_{22}$ in the second axial direction can have magnetic field strengths differing from each other.

Formula 8

$$\theta_1 = \mathrm{atan}\left(\frac{|S_{1-22} - S_{1-21}|}{|S_{1-12} - S_{1-11}|}\right) \quad (3)$$

Formula 9

$$\theta_2 = \mathrm{atan}\left(\frac{|S_{2-22} - S_{2-21}|}{|S_{2-12} - S_{2-11}|}\right) \quad (4)$$

With the present invention, it is possible to provide a magnetic sensor device capable of highly accurate detection of a magnetic field in three axial directions, and a method of manufacturing such, along with a rotational operation mechanism.

DETAILED DESCRIPTION

Figure 1:
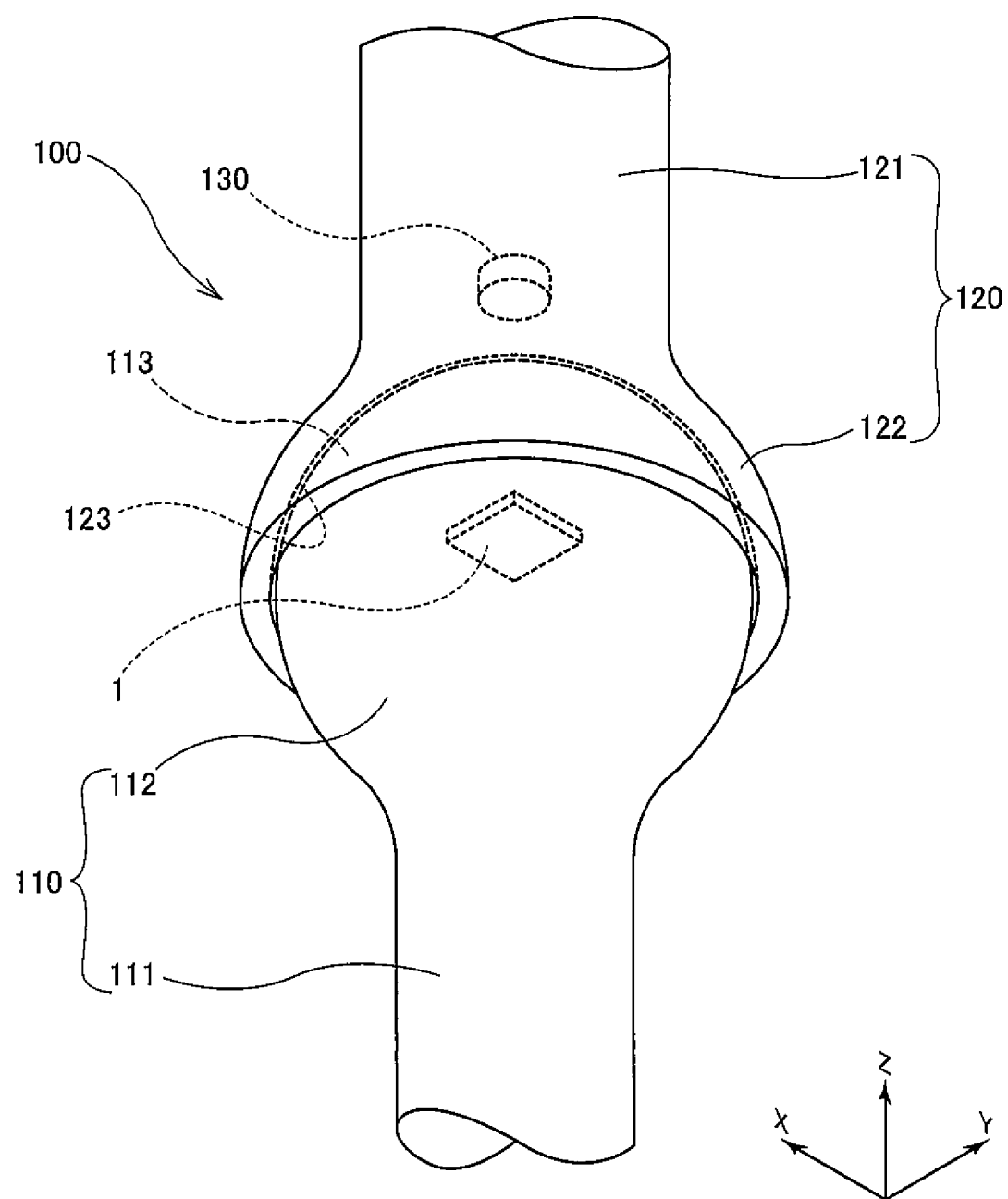
FIG. 1 is a perspective view showing the summary configuration of a joint mechanism using the magnetic sensor device according to an embodiment of the present invention.

An embodiment of the present invention will be described with reference to the drawings. FIG. 1 is a perspective view showing the summary configuration of a joint mechanism using the magnetic sensor device according to this embodiment, and FIG. 2 is a cross-sectional view showing the summary configuration of a joint mechanism using the magnetic sensor device according to this embodiment.

Figure 2:
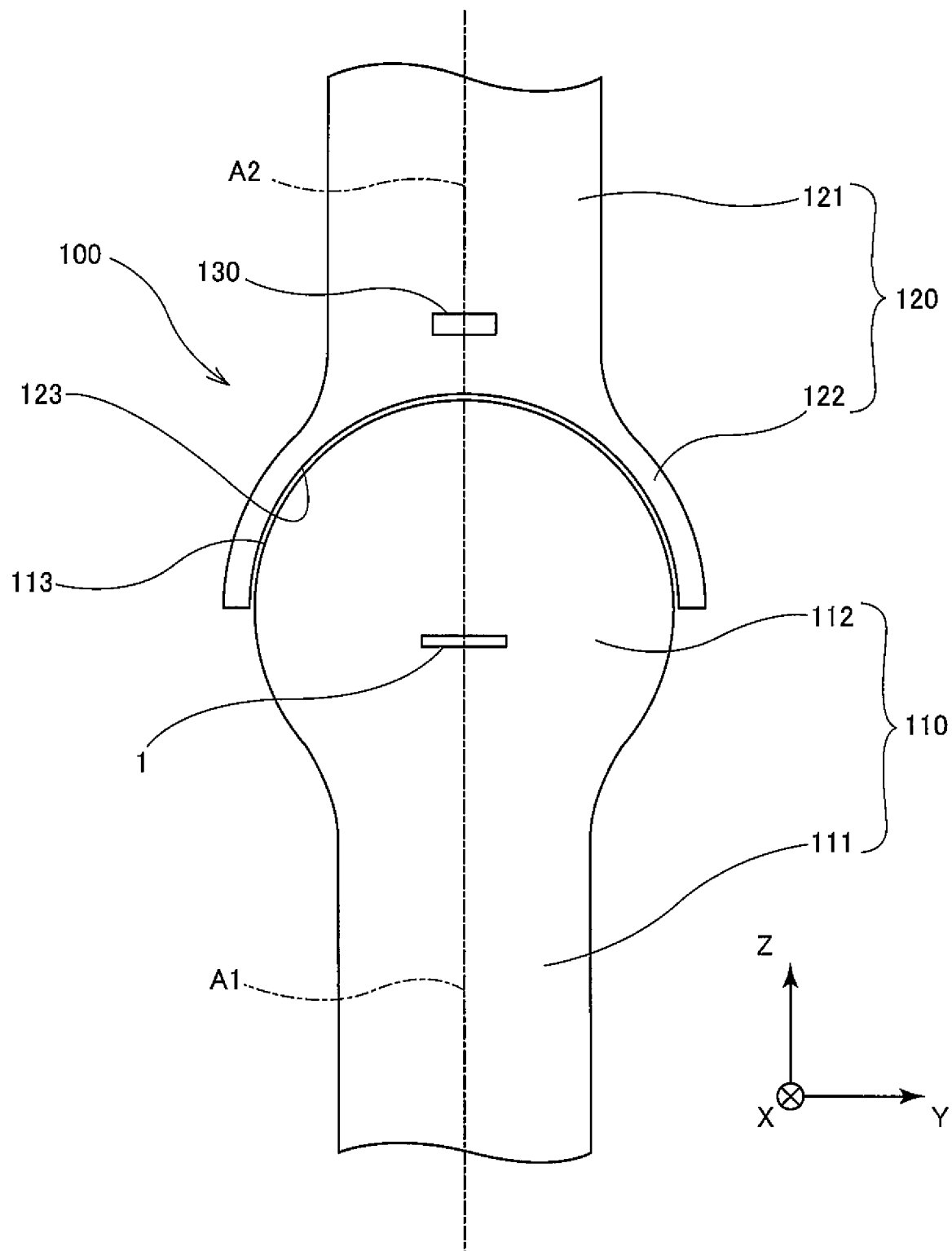
FIG. 2 is a cross-sectional view showing the summary configuration of a joint mechanism using the magnetic sensor device according to an embodiment of the present invention.

As shown in FIG. 1 and FIG. 2, a joint mechanism 100 in this embodiment includes a first member 110, a second member 120, a magnetic sensor device 1 and a magnetic field generator 130.

The first member 110 includes a first shaft 111 and a spherical part 112 connected to one end of the first shaft 111 in the lengthwise direction. The spherical part 112 has a spherical surface including a convex sphere 113, and the portion of the spherical surface other than the convex sphere 113 is a boundary section between the first shaft 111 and the spherical part 112.

The second member 120 includes a second shaft 121 and a receiving part 122 connected to one end of the second shaft 121 in the lengthwise direction. The receiving part 122 includes a concave sphere 123.

The first member 110 and the second member 120 are connected so that the mutual positional relationship can change, such that the axis A1 of the first shaft 111 of the first member 110 and the axis A2 of the second shaft 121 of the second member 120 are positioned on the same line in an attitude with the spherical part 112 fitted into the receiving part 122. The size of the receiving part 122 should be the same size as or slightly larger than the size of the spherical part 112. The convex sphere 113 and the concave sphere 123 may be in contact with each other or may be mutually opposite each other so that a lubricant or the like is interposed in between. The joint mechanism 100 in this embodiment is a ball-and-socket having semispherical joint head and joint cavity and is a rotational operation mechanism capable of rotating about the axis A1 of the first shaft 111 of the first member 110 and about the axis A2 of the second shaft 121 of the second member 120. The rotational operation mechanism is capable of rotating with the spherical part 112 and the receiving part 122 as a fulcrum so that the angle formed by the axis A1 of the first shaft 111 of the first member 110 and the axis A2 of the second shaft 121 of the second member 120 can change.

The rotational operation mechanism in this embodiment is not limited to the above-described joint mechanism 100. The rotational operation mechanism may, for example, be a joystick that includes a lever housing the magnetic sensor device 1, and a support unit housing the magnetic field generator 130 and supporting this lever to be capable of movement, such that the relative position of the field generator 130 with respect to the magnetic sensor device 1 changes along a prescribed sphere.

The rotational operation mechanism may, for example, be a trackball that includes a ball housing the magnetic sensor device 1 and a support unit housing the magnetic field generator 130 and supporting the ball such that the ball is capable of rotating, so that the relative position of the magnetic field generator 130 with respect to the magnetic sensor device 1 changes along a prescribed sphere.

In the joint mechanism 100 in this embodiment, the magnetic sensor device 1 is housed in the spherical part 112 of the first member 110 without protruding from the convex sphere 113, and the magnetic field generator 130 is housed in the receiving part 122 of the second member 120 without protruding from the concave sphere 123.

The magnetic field generator 130 should be one that generates a prescribed magnetic field, and for example, should be a magnet. The magnetic field generated by the magnetic field generator 130 includes three magnetic field components differing from each other at a reference position. The magnetic sensor device 1 detects the relative position with the magnetic field generator 130. The magnetic sensor device 1 outputs a first sensor signal $S_1$, a second sensor signal $S_2$ and a third sensor signal Sa corresponding to the three magnetic field components included in the magnetic field generated by the magnetic field generator 130.

Figure 3:
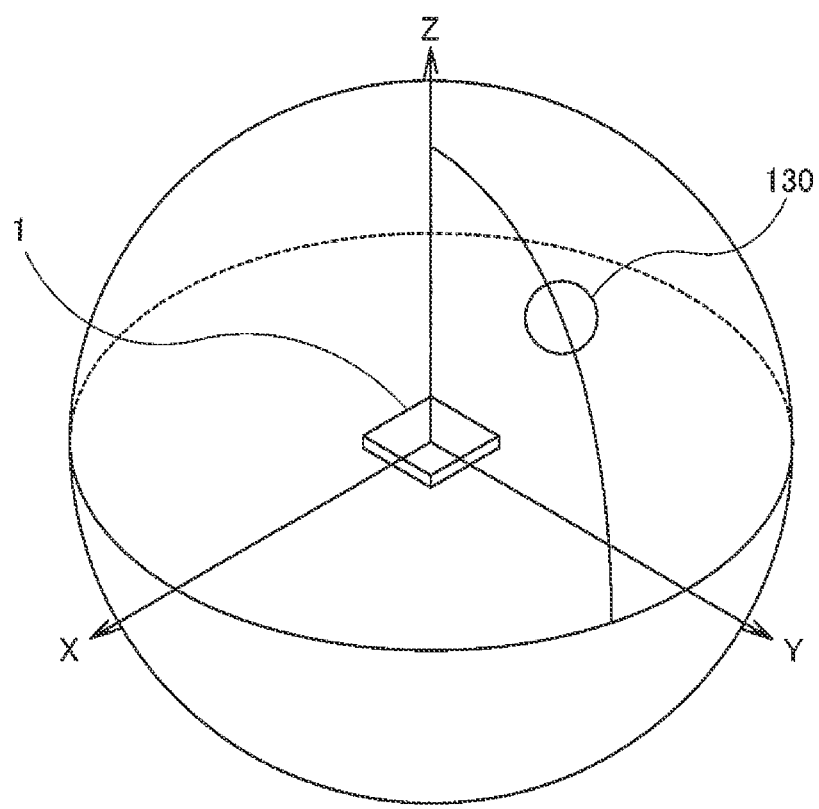
FIG. 3 is a diagram for describing the reference coordinate system used in the magnetic sensor device according to the embodiment of the present invention.

Here, the relative positional relationship between the magnetic sensor device 1 and the magnetic field generator 130 according to this embodiment will be described through a reference coordinate system. As shown in FIG. 3, the reference coordinate system is a coordinate system with the magnetic sensor device 1 as a reference and is an orthogonal coordinate system defined by three axes for expressing the values of the first sensor signal $S_1$, the second sensor signal $S_2$ and the third sensor signal $S_3$.

An X-direction, a Y-direction and a Z-direction are defined in the reference coordinate system. The X-direction, Y-direction and Z-direction are mutually orthogonal directions. The opposite direction to the X-direction is defined as the −X-direction, the opposite direction to the Y-direction is defined as the −Y-direction, and the opposite direction to the Z-direction is defined as the −Z-direction.

The magnetic sensor device 1 outputs the first sensor signal $S_1$, the second sensor signal $S_2$ and the third sensor signal $S_3$ in correspondence with the three mutually differing magnetic field components at the reference position generated from the magnetic field generator 130. The three magnetic field components are a magnetic field component HX parallel to the X-direction, a magnetic field component HY parallel to the Y-direction and a magnetic field component HZ parallel to the Z-direction. The third sensor signal $S_3$ is output in correspondence with the magnetic field component HX parallel to the X-direction, the first sensor signal $S_1$ is output in correspondence with the magnetic field component HY parallel to the Y-direction and the second sensor signal $S_2$ is output in correspondence with the magnetic field component HZ parallel to the Z-direction.

In the reference coordinate system, the position of the magnetic sensor device 1 does not change. When the relative position of the magnetic field generator 130 with respect to the magnetic sensor device 1 changes, the position of the magnetic field generator 130 in the reference coordinate system changes along a prescribed sphere. That is, in the joint mechanism 100, when the first member 110 and the second member 120 move rotationally relative to each other, the position of the magnetic field generator 130 in the reference coordinate system changes along a prescribed sphere.

Figure 4A:
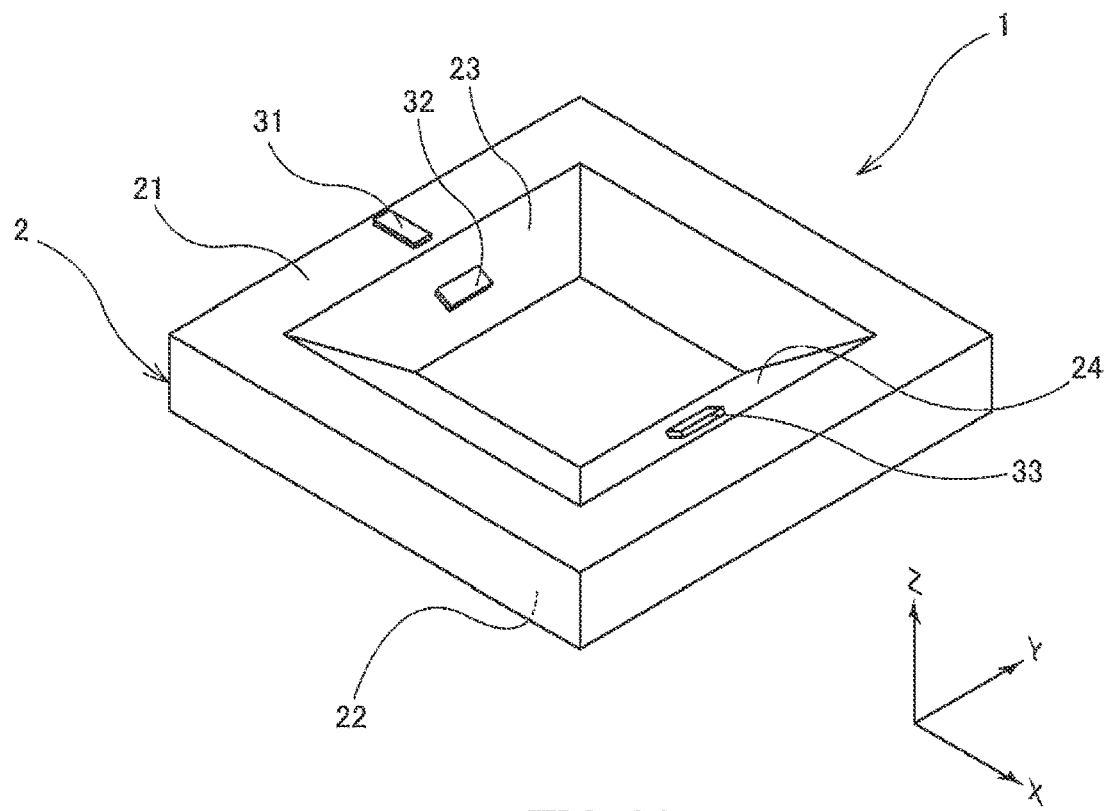
FIG. 4A is a perspective view showing the summary configuration of the magnetic sensor device according to the embodiment of the present invention.
Figure 4B:
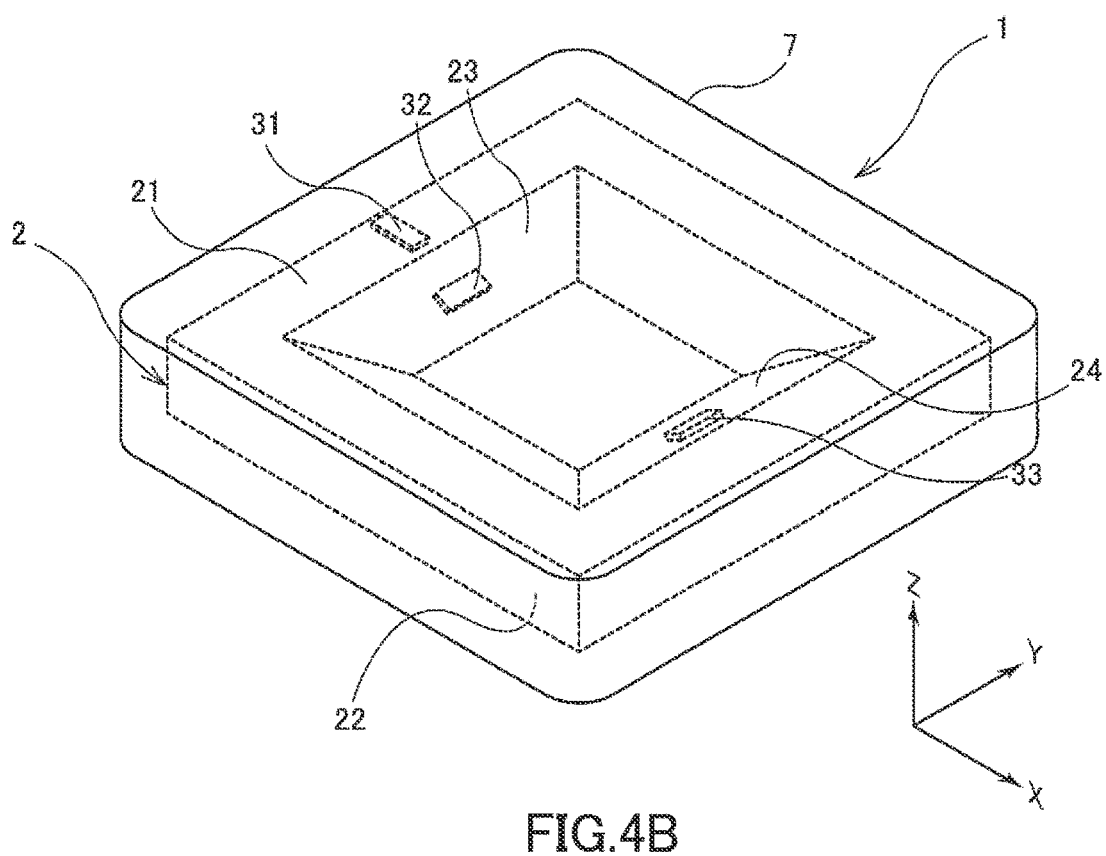
FIG. 4B is a perspective view showing the summary configuration of the magnetic sensor device according to the embodiment of the present invention.

As shown in FIG. 4A and FIG. 4B, the magnetic sensor device 1 according to this embodiment includes a base 2 having a first surface 21 and a second surface 22 positioned on the opposite side of the first surface 21 in the Z-direction; an X-axis magnetic sensor unit 31 for detecting magnetism in the X-direction; a Y-axis magnetic sensor unit 32 for detecting magnetism in the Y-direction; a Z-axis magnetic sensor unit 33 for detecting magnetism in the Z-direction; a signal processing unit 4 for accomplishing signal processing on the basis of the output signals from each of the X-axis magnetic sensor unit 31, the Y-axis magnetic sensor unit 32 and the Z-axis magnetic sensor unit 33 (see FIG. 13); and a sealing part 7 made of sealing resin that integrally seals the base 2, the X-axis magnetic sensor unit 31, the Y-axis magnetic sensor unit 32, the Z-axis magnetic sensor unit 33 and the signal processing unit 4. The X-direction and the Y-direction are mutually orthogonal directions in the first surface 21 of the base 2, and the Z-direction is a direction orthogonal to the first surface 21 of the base 2 that includes the X-direction and the Y-direction. The X-direction, Y-direction and Z-direction respectively correspond to the X-direction, Y-direction and Z-direction in the above-described reference coordinate system (see FIG. 3).

A first inclined surface 23 and a second inclined surface 24, which are opposite to each other in the Y-direction, are formed in the first surface 21 of the base 2. The inclination angle $\theta_1$ of the first inclined surface 23 and the inclination angle $\theta_2$ of the second inclined surface 24 each vary with respect to the ideal angle (the design angle in the magnetic sensor device 1). The first inclined surface 23 and the second inclined surface 24 are formed by etching or the like of the substrate that includes the base 2. Consequently, the variation in the inclination angles $\theta_1$ and $\theta_2$ is dependent on the variation of the processing conditions of etching or the like at the time of formation of the first inclined surface 23 and the second inclined surface 24 and is not particularly limited.

The variation in the inclination angles $\theta_1$ and $\theta_2$ is for example within ±3.0 deg from the ideal angle (the design angle in the magnetic sensor device 1).

The base 2 may be a semiconductor substrate such as a silicon wafer or the like; a ceramic substrate such as an AlTiC substrate, an alumina substrate or the like; a resin substrate; or a glass substrate or the like, for example. Depending on the type of material that makes up the base 2, an insulating layer including $Al_2O_3$ or the like may be provided on at least the first surface 21, the first inclined surface 23 and the second inclined surface 24 of the base 2.

Figure 5:
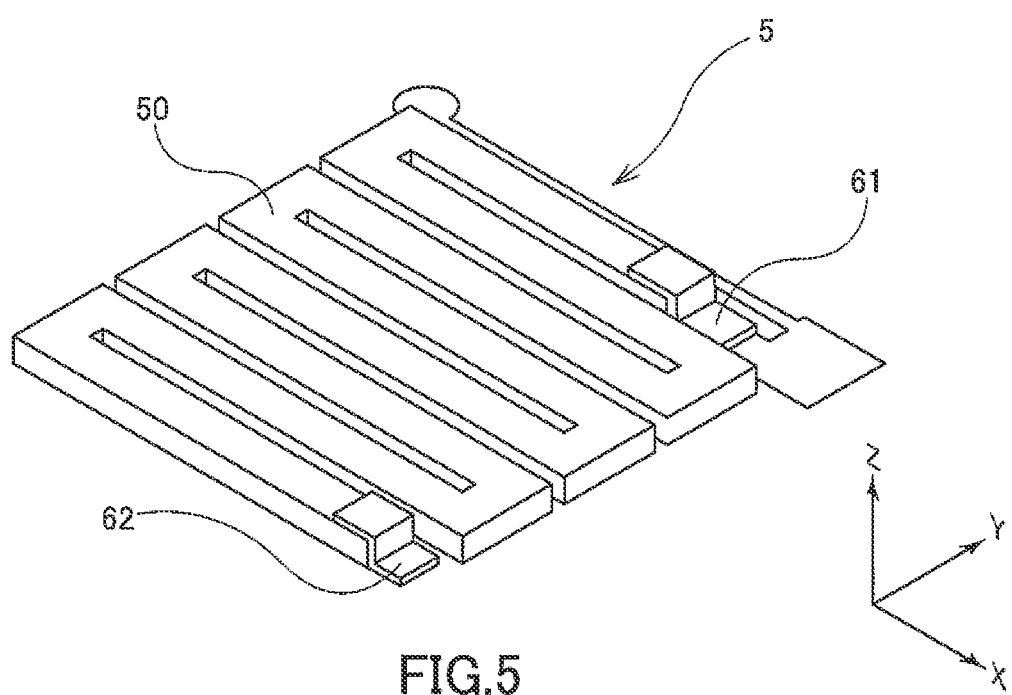
FIG. 5 is a perspective view showing the summary configuration of one example of the magnetoresistive effect element in the embodiment of the present invention.
Figure 6:
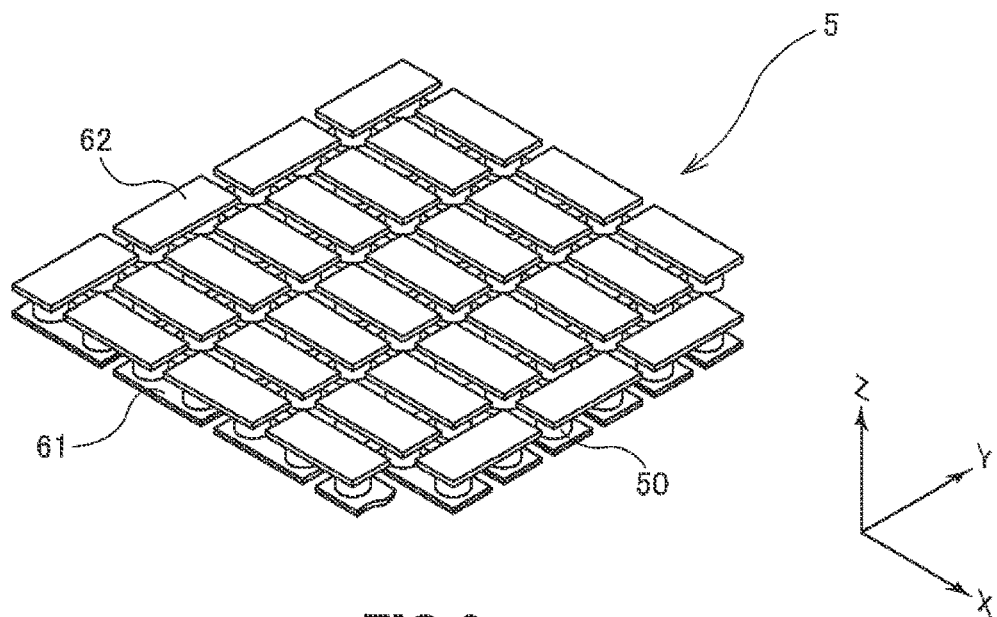
FIG. 6 is a perspective view showing the summary configuration of another example of the magnetoresistive effect element in the embodiment of the present invention.

The X-axis magnetic sensor unit 31, the Y-axis magnetic sensor unit 32 and the Z-axis magnetic sensor device 33 all include magnetoresistive effect elements 5. As shown in FIG. 5 and FIG. 6, the magnetoresistive effect elements 5 are all GMR elements or TMR elements and are provided with a magnetoresistive effect laminated body 50 and a first lead electrode 61 and second lead electrode 62 electrically connected to the magnetoresistive effect laminated body 50.

The first lead electrode 61 and the second lead electrode 62 are made of one type of electroconductive material out of Cu, Al, Au, Ta, Ti or the like, for example, or a composite film of two or more electroconductive materials, and the thickness thereof is on the order of 0.3~2.0 μm each.

In general, a GMR element as the magnetoresistive effect element 5 has a relatively low element resistance value. Consequently, in order to output a signal of a prescribed strength from the magnetic sensor device 1, preferably, the linewidths of the magnetoresistive effect element 5 are narrow and the line lengths are long. To make the linewidths of the magnetoresistive effect element 5 narrow and the line lengths long within the limited region in the first surface 21, the first inclined surface 23 and the second inclined surface 24 of the base 2, the magnetoresistive effect element 5 is preferably formed in a meandering shape.

In addition, in general a TMR element as the magnetoresistive effect element 5 has a relatively high element resistance value. Consequently, by connecting a plurality of TMR elements in series, it is possible to realize a high withstanding voltage performance, and it is also possible to cause a signal of prescribed strength to be output from the magnetic sensor element 1. To connect a plurality of magnetoresistive effect elements 5 in series within the limited region in the first surface 21, the first inclined surface 23 and the second inclined surface 24 of the base 2, the magnetoresistive effect elements 5 are preferably formed in a meandering shape.

The entirety of the magnetoresistive effect element 5 formed in a meandering shape is made of a magnetoresistive effect laminated body 50, the first lead electrode 61 and the second lead electrode 62 may each be connected to the two ends of the magnetoresistive effect laminated body 50 in a meandering shape (see FIG. 5), and a plurality of magnetoresistive effect laminated bodies 50 that are circular in shape in the planar view may have a configuration connected in series in a meandering shape via a plurality of first lead electrodes 61 and second lead electrodes 62 (see FIG. 6). The shape of the magnetoresistive effect laminated body 50 is not limited to circular in the planar view but may be elliptical in the planar view (see FIG. 7), rectangular in the planar view, or the like.

Figure 7:
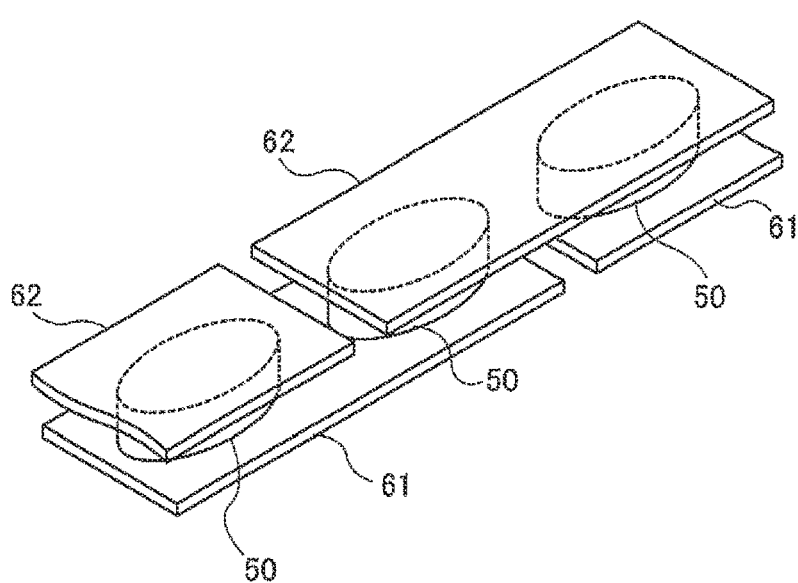
FIG. 7 is a partial, enlarged perspective view showing a schematic configuration of the magnetoresistive effect element shown in FIG. 6.

In the magnetoresistive effect elements 5 shown in FIG. 6 and FIG. 7, the plurality of first lead electrodes 61 is provided on the first surface 21, the first inclined surface 23 and the second inclined surface 24 of the base 2. Each of the first lead electrodes 61 each has a long, slender, roughly rectangular shape, and a prescribed gap is provided between two adjacent first lead electrodes 61 in the direction of electrical series of the plurality of magnetoresistive effect laminated bodies 50 arranged in an array. A magnetoresistive effect laminated body 50 is provided near each end of the first lead electrodes 61 in the lengthwise direction. That is, two magnetoresistive effect laminated bodies 50 are provided on each of the first lead electrodes 61.

In the magnetoresistive effect elements 5 shown in FIG. 6 and FIG. 7, the plurality of second lead electrodes 62 is provided on the plurality of magnetoresistive effect laminated bodies 50. Each second lead electrode 62 has a long, slender, roughly rectangular shape. The second lead electrodes 62 are arranged to connect the plurality of magnetoresistive effect laminated bodies 50 in series in an array, having a prescribed gap between two second lead electrodes 62 adjacent in the electrical series direction of the plurality of the magnetoresistive effect laminated bodies 50 arranged in the array, and the second lead electrodes 62 electrically connect the antiferromagnetic layers 54 (see FIG. 8) of two adjacent magnetoresistive effect laminated bodies 50.

Figure 8:
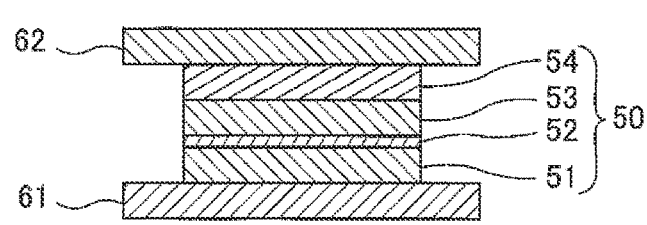
FIG. 8 is a cross-sectional view showing a summary configuration of the magnetoresistive effect element shown in FIG. 6.

As shown in FIG. 8, the magnetoresistive effect laminated bodies 50 include a free layer 51, a nonmagnetic layer 52, a magnetization fixed layer 53, and an antiferromagnetic layer 54, layered in that order from the first lead electrode 61 side. The free layer 51 is electrically connected to the first lead electrode 61. The antiferromagnetic layer 54 is made of an antiferromagnetic material and serves the role of fixing the direction of magnetization of the magnetization fixed layer 53 by being exchange-coupled with the magnetization fixed layer 53. The magnetoresistive effect laminated bodies 50 may also have a configuration in which the free layer 51, the nonmagnetic layer 52, the magnetization fixed layer 53 and the antiferromagnetic layer 54 are layered in that order from the second lead electrode 62 side. In addition, the antiferromagnetic layer 54 may be omitted by the magnetization fixed layer 53 being a so-called self-pinned fixed layer (Synthetic Ferri Pinned layer, or SFP layer) having a layered ferri structure of a ferromagnetic layer/nonmagnetic intermediate layer/ferromagnetic layer where both ferromagnetic layers are antiferromagnetically coupled. The magnetoresistive effect laminated bodies 50 in this embodiment may include an underlayer positioned between the free layer 51 and the first lead electrode 61 and may also contain a cap layer positioned between the antiferromagnetic layer 54 and the second lead electrode 62.

In TMR elements, the nonmagnetic layer 52 is a tunnel barrier layer. In GMR elements, the nonmagnetic layer 52 is a nonmagnetic electroconductive layer. In the magnetoresistive effect elements 5 (TMR elements and GMR elements), the resistance value changes in accordance with the angle formed by the direction of magnetization of the free layer 51 with respect to the direction of magnetization of the magnetization fixed layer 53, and the resistance value is a minimum when this angle is 0° (when the magnetization directions are parallel to each other) and the resistance value is a maximum when this angle is 180° (when the magnetization directions are antiparallel to each other). In the magnetoresistive effect element 5, the easy magnetization axial direction of the free layer 51 is a direction orthogonal to the direction of magnetization of the magnetization fixed layer 53.

In this embodiment, the magnetization direction of the magnetization fixed layer 53 of the X-axis magnetoresistive effect elements 5 included in the X-axis magnetic sensor unit 31 is fixed in a direction parallel to the first surface 21 of the base 2 (the film surface of the X-axis magnetoresistive effect elements 5). The magnetization direction of the magnetization fixed layer 53 of the Y-axis magnetoresistive effect elements 5 included in the Y-axis magnetic sensor unit 32 is fixed in a direction parallel to the first inclined surface 23 of the base 2 (the film surface of the Y-axis magnetoresistive effect elements 5). The magnetization direction of the magnetization fixed layer 53 of the Z-axis magnetoresistive effect elements 5 included in the Z-axis magnetic sensor unit 33 is fixed in a direction parallel to the second inclined surface 24 of the base 2 (the film surface of the Z-axis magnetoresistive effect elements 5).

Figure 9:
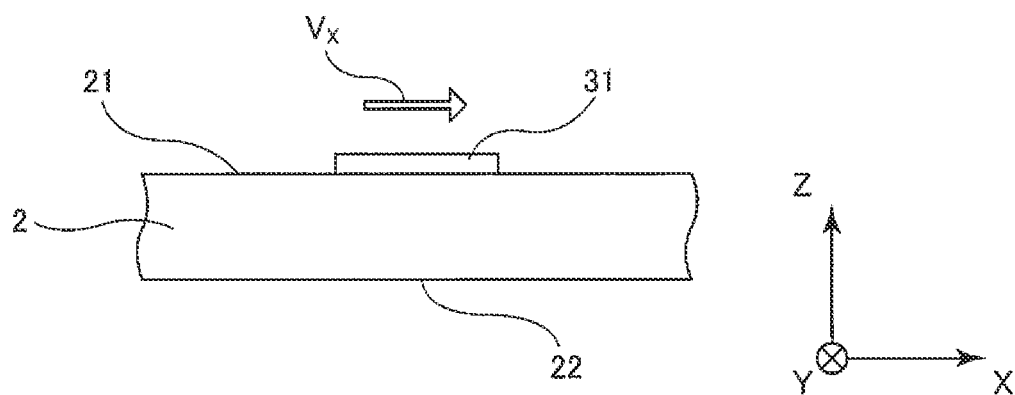
FIG. 9 is an explanatory diagram for describing the relationship between the magnetoreception direction of the X-axis magnetic sensor unit and the direction of an applied magnetic field in the embodiment of the present invention.

The magnetoreception direction of the X-axis magnetic sensor unit 31 provided in the first surface 21 of the base 2 is the X-direction. Consequently, the magnetoresistive effect element 5 of the X-axis magnetic sensor unit 31 indicates the resistance value change in accordance with a magnetic vector Vx indicating the magnetic field in the X-direction, and a signal corresponding to this resistance value change is output from the X-axis magnetic sensor unit 31 (see FIG. 9).

Figure 10:
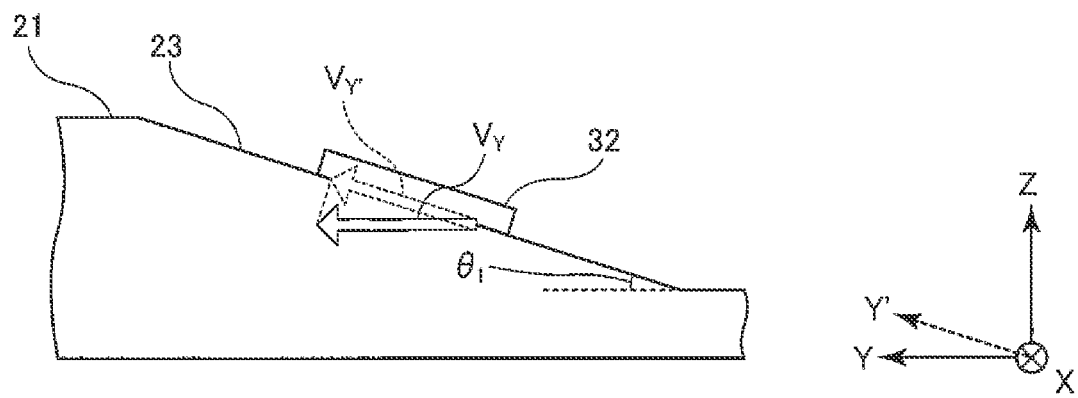
FIG. 10 is an explanatory diagram for describing the relationship between the magnetoreception direction of the Y-axis magnetic sensor unit and the direction of an applied magnetic field in the embodiment of the present invention.

On the other hand, the magnetoreception direction of the Y-axis magnetic sensor unit 32 provided in the first inclined surface 23 is the Y' direction, which is inclined at the inclination angle $\theta_1$ of the first inclined surface 23 with respect to the Y-direction, and the magnetoception direction of the Z-axis magnetic sensor unit 33 provided in the second inclined surface 24 is the Z' direction, which is inclined at the inclination angle 92 of the second inclined surface 24 with respect to the Z-direction. Consequently, the magnetoresistive effect elements 5 of the Y-axis magnetic sensor unit 32 indicate the resistance value change in accordance with the "magnetic vector $V_{Y'}$ in the Y' direction", which is the magnetic vector $V_Y$ indicating the magnetic field in the Y-direction projected onto the first inclined surface 23, and a signal corresponding to that resistance value change is output from the Y-axis magnetic sensor unit 32 (see FIG. 10).

In addition, the magnetoresistive effect element 5 of the Z-axis magnetic sensor unit 33 indicates the resistance value change in accordance with the "magnetic vector $V_{Z'}$ in the Z' direction", which is the magnetic vector $V_Z$ indicating the magnetic field in the Z-direction projected onto the second inclined surface 24, and a signal corresponding to that resistance value change is output from the Z-axis magnetic sensor unit 33.

Accordingly, when signal processing is accomplished in the signal processing unit 4 with the output signal from the Y-axis magnetic sensor unit 32 and the output signal from the Z-axis magnetic sensor unit 33 as the signals corresponding to the magnetic field in the Y-direction and the magnetic field in the Z-direction, errors at times arise in the signal processing results. As described below, in this embodiment, because the output signal from the Y-axis magnetic sensor unit 32 and the output signal from the Z-axis magnetic sensor unit 33 are corrected in the signal processing unit 4, a corrected signal is generated and signal processing is accomplished using this corrected signal, and the magnetic field in the three axial directions (X-axis, Y-axis and Z-axis) can be detected with high accuracy without large errors arising in the signal processing results.

Figure 12:
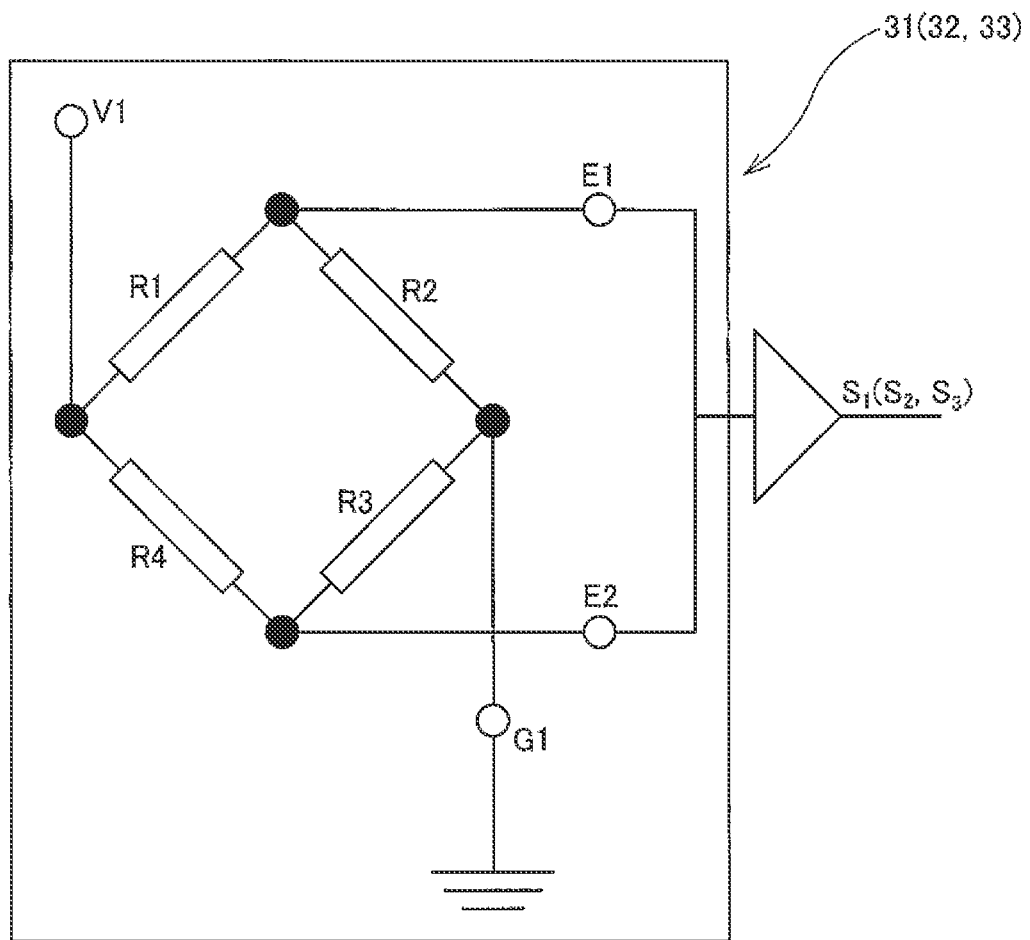
FIG. 12 is a circuit diagram showing the circuit configuration of the X-axis magnetic sensor unit, the Y-axis magnetic sensor unit and the Z-axis magnetic sensor unit in the embodiment of the present invention.

The circuit configuration of the X-axis magnetic sensor unit 31, the Y-axis magnetic sensor unit 32 and the Z-axis magnetic sensor unit 33 in this embodiment should be a Wheatstone bridge circuit in which four resistance units, namely, a first resistance unit R1, a second resistance unit R2, a third resistance unit R3 and a fourth resistance unit R4, are bridge-connected (see FIG. 12). The circuit configuration of the X-axis magnetic sensor unit 31, the Y-axis magnetic sensor unit 32 and the Z-axis magnetic sensor unit 33 may also be a half-bridge circuit in which two resistance units, namely, the first resistance unit R1 and the second resistance unit R2, are connected in series.

The Wheatstone bridge circuit includes a power source port V1, a ground port G1, a first output port E1, a second output port E2, the first resistance unit R1 provided between the power source port V1 and the first output port E1, the second resistance unit R2 provided between the first output port E1 and the ground port G1, the third resistance unit R3 provided between the second output port E2 and the ground port G1, and the fourth resistance unit R4 provided between the power source port V1 and the second output port E2. A power source voltage (constant electric current) of a prescribed magnitude is applied to the power source port V1 by connection to a constant current source, and the ground port G1 is connected to ground. The constant electric current applied to the power source port V1 is controlled to the prescribed electric current value by an undepicted driver IC.

In this embodiment, the first resistance unit R1, the second resistance unit R2, the third resistance unit R3 and the fourth resistance unit R4 can each include a magnetoresistive effect element 5. In the X-axis magnetic sensor unit 31, the magnetization directions of the magnetization fixed layers 53 in all of the magnetoresistive effect laminated bodies 50 of the first resistance unit R1 and the third resistance unit R3 are fixed in the same direction (+X-direction), and the magnetization directions of the magnetization fixed layers 53 in all of the magnetoresistive laminated bodies 50 of the second resistance unit R2 and the fourth resistance unit R4 are the same and are fixed in a direction (−X-direction) antiparallel to the magnetization direction of the magnetization fixed layers 53 of the first resistance unit R1 and the third resistance unit R3. The magnetization directions of the magnetization fixed layers 53 of the first resistance unit R1 and the third resistance unit R3 may be inclined at an angle within ±10° of the +X-direction, and preferably at an angle within ±5°, and the magnetization directions of the magnetization fixed layers 53 of the first resistance unit R1 and the third resistance unit R3 need not perfectly coincide. In addition, the magnetization directions of the magnetization fixed layers 53 of the second resistance unit R2 and the fourth resistance unit R4 may be inclined at an angle within ±10° of the −X-direction, and preferably at an angle within ±5°, and the magnetization directions of the magnetization fixed layers 53 of the second resistance unit R2 and the fourth resistance unit R4 need not perfectly coincide.

In the Y-axis magnetic sensor unit 32, the magnetization directions of the magnetization fixed layers 53 in all of the magnetoresistive effect laminated bodies 50 of the first resistance unit R1 and the third resistance unit R3 are fixed in the same direction (+Y' direction), and the magnetization directions of the magnetization fixed layers 53 in all of the magnetoresistive laminated bodies 50 of the second resistance unit R2 and the fourth resistance unit R4 are the same and are fixed in a direction (−Y' direction) antiparallel to the magnetization direction of the magnetization fixed layers 53 of the first resistance unit R1 and the third resistance unit R3. The magnetization directions of the magnetization fixed layers 53 of the first resistance unit R1 and the third resistance unit R3 may be inclined at an angle within ±10° of the +Y' direction, and preferably at an angle within ±5°, and the magnetization directions of the magnetization fixed layers 53 of the first resistance unit R1 and the third resistance unit R3 need not perfectly coincide. In addition, the magnetization directions of the magnetization fixed layers 53 of the second resistance unit R2 and the fourth resistance unit R4 may be inclined at an angle within ±10° of the −Y' direction, and preferably at an angle within ±5°, and the magnetization directions of the magnetization fixed layers 53 of the second resistance unit R2 and the fourth resistance unit R4 need not perfectly coincide.

In the Z-axis magnetic sensor unit 33, the magnetization directions of the magnetization fixed layers 53 in all of the magnetoresistive effect laminated bodies 50 of the first resistance unit R1 and the third resistance unit R3 are fixed in the same direction (+Z' direction), and the magnetization directions of the magnetization fixed layers 53 in all of the magnetoresistive effect laminated bodies 50 of the second resistance unit R2 and the fourth resistance unit R4 are the same and are fixed in a direction (−Z' direction) antiparallel to the magnetization direction of the magnetization fixed layers 53 of the first resistance unit R1 and the third resistance unit R3. The magnetization directions of the magnetization fixed layers 53 of the first resistance unit R1 and the third resistance unit R3 may be inclined at an angle within ±10° of the +Z' direction, and preferably at an angle within ±5°, and the magnetization directions of the magnetization fixed layers 53 of the first resistance unit R1 and the third resistance unit R3 need not perfectly coincide. In addition, the magnetization directions of the magnetization fixed layers 53 of the second resistance unit R2 and the fourth resistance unit R4 may be inclined at an angle within ±10° of the −Z' direction, and preferably at an angle within ±5°, and the magnetization directions of the magnetization fixed layers 53 of the second resistance unit R2 and the fourth resistance unit R4 need not perfectly coincide.

Figure 11:
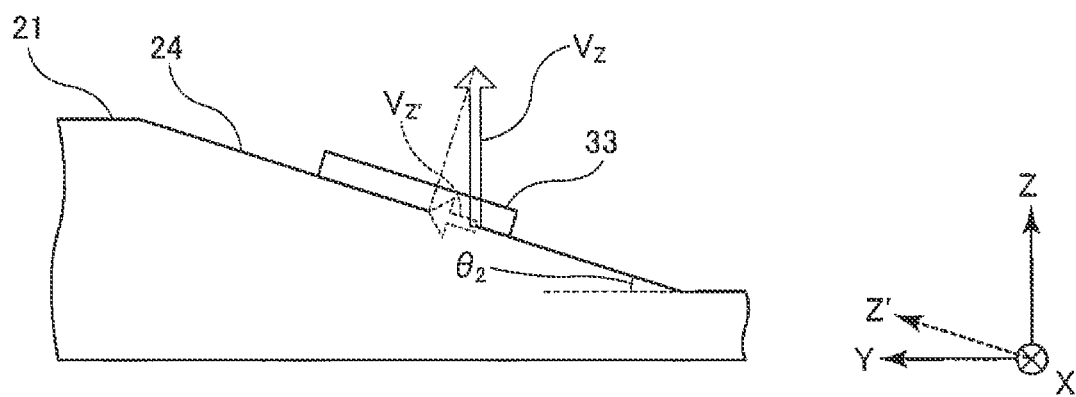
FIG. 11 is an explanatory diagram for describing the relationship between the magnetoreception direction of the Z-axis magnetic sensor unit and the direction of an applied magnetic field in the embodiment of the present invention.

By having the magnetization directions of the magnetization fixed layers 53 in each of the magnetoresistive effect laminated bodies 50 of the X-axis magnetic sensor unit 31, the Y-axis magnetic sensor unit 32 and the Z-axis magnetic sensor unit 33 be fixed in the above-described directions, the potential difference between the first output port E1 and the second output port E2 changes accompanying resistance value changes of the first through fourth resistance units R1-R4 in accordance with the magnetic vector Vx in the X-direction (see FIG. 9), the magnetic vector $V_{Y'}$ in the Y' direction (see FIG. 10), and the magnetic vector $V_{Z'}$ in the Z' direction (see FIG. 11), and a signal is output as the change in that potential difference.

Figure 13:
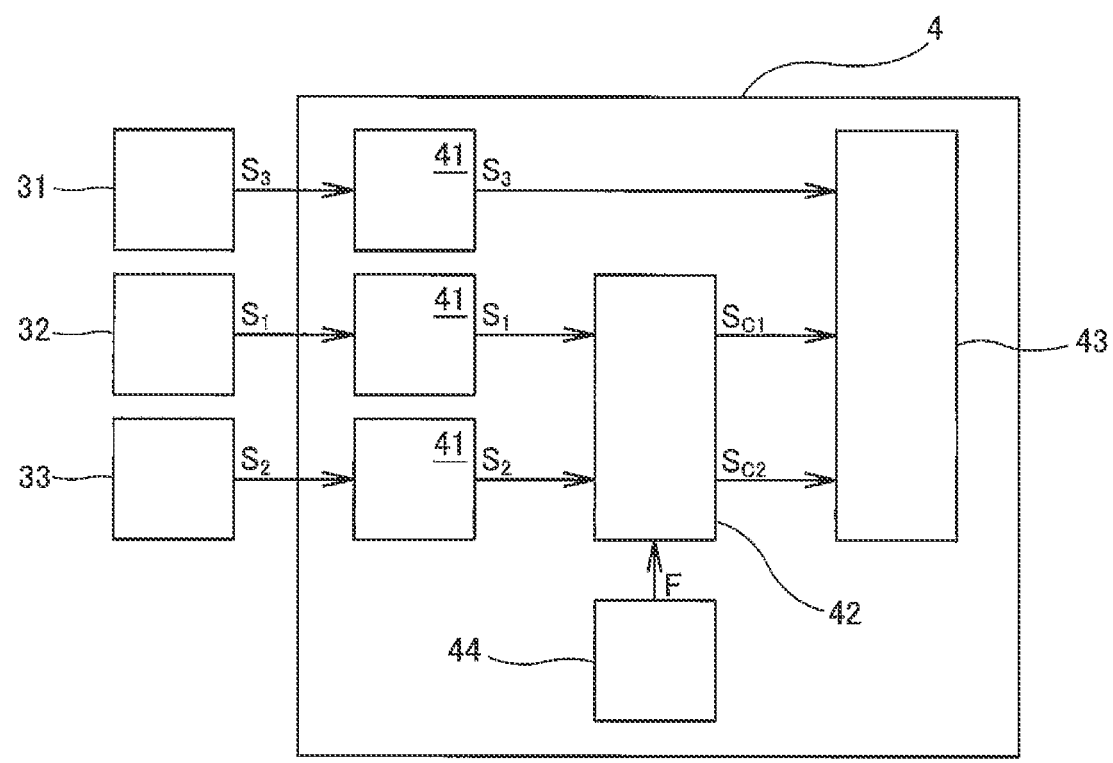
FIG. 13 is a block diagram showing the summary configuration of the signal processing unit of the magnetic sensor device according to the embodiment of the present invention.

As shown in FIG. 13, the signal processing unit 4 comprises an A/D (analog/digital) converter 41 that converts the analog signals (sensor signals) output from the X-axis magnetic sensor unit 31, the Y-axis magnetic sensor unit 32 and the Z-axis magnetic sensor unit 33 into digital signals; a corrected signal generator 42 into which the digital signal converted to digital by the A/D converter 41 is input and that corrects the digital signal and generates a corrected signal; a arithmetic processor 43 that accomplishes arithmetic processing using the digital signal and the corrected signal; and a memory unit 44, which stores the correction coefficient used to correct the digital signal and to generate the corrected signal in the corrected signal generator 42. The signal processing unit 4 should be comprised, for example, of a microcomputer, an ASIC (Application Specific Integrated Circuit) or the like.

The A/D converter 41 converts the analog signal (third sensor signal $S_3$) output from the X-axis magnetic sensor unit 31, the analog signal (first sensor signal $S_1$) output from the Y-axis magnetic sensor unit 32 and the analog signal (second sensor signal $S_2$) output from the Z-axis magnetic sensor unit 33 each into a digital signal. The third sensor signal $S_3$ converted into a digital signal by the A/D converter 41 is input into the arithmetic processor 43, and the first sensor signal $S_1$ and the second sensor signal $S_2$ converted into digital signals by the A/D converter 41 are input into the corrected signal generator 42.

When the first sensor signal $S_1$ and the second sensor signal $S_2$ that have been converted into digital signals are input, the corrected signal generator 42 corrects the digital signals and generates corrected signals using the correction coefficient stored in the memory unit 44. For example, the corrected signal generator 42 generates a first corrected signal $S_{C1}$ based on below-described Equation (1), from the first sensor signal $S_1$ converted into a digital signal by the A/D converter 41. In addition, the corrected signal generator 42 generates a second corrected signal $S_{C2}$ based on below-described Equation (2), from the second sensor signal $S_2$ converted into a digital signal by the A/D converter 41.

Formula 10

$$S_{C1} = \frac{\sin\theta_2 \cdot S_1 + \sin\theta_1 \cdot S_2}{\sin(\theta_1 + \theta_2)} \quad (1)$$

Formula 11

$$S_{C2} = \frac{\cos\theta_2 \cdot S_1 + \cos\theta_1 \cdot S_2}{\sin(\theta_1 + \theta_2)} \quad (2)$$

In the above-described Equation (1) and Equation (2), $S_{C1}$ indicates the first corrected signal, $S_{C2}$ indicates the second corrected signal, $S_1$ indicates the first sensor signal, $S_2$ indicates the second sensor signal, $\theta_1$ indicates the inclination angle of the first inclined surface 23, and $\theta_2$ indicates the inclination angle of the second inclined surface 24.

The inclination angle $\theta_1$ of the first inclined surface 23 is an angle that is calculated from below-described Equation (3) using the signals $S_{1-11}$, $S_{1-12}$, $S_{1-21}$ and $S_{1-22}$ output from the Y-axis magnetic sensor unit 32, and converted into digital signals by the A/D/converter 41, when a first magnetic field $H_{11}$ and a second magnetic field $H_{12}$ in the Y-axis direction, along with a first magnetic field $H_{21}$ and a second magnetic field $H_{22}$ in the Z-axis direction, are each applied to the magnetic sensor device 1. The inclination angle $\theta_2$ of the second inclined surface 24 is an angle that is calculated from the below-described Equation (4) using the signals $S_{2-11}$, $S_{2-12}$, $S_{2-2}$, and $S_{2-22}$ output from the Z-axis magnetic sensor unit 33 and converted into digital signals by the A/D/converter 41, when the first magnetic field $H_{11}$ and the second magnetic field $H_{12}$ in the Y-axis direction, along with the first magnetic field $H_{21}$ and the second magnetic field $H_{22}$ in the Z-axis direction, are each applied to the magnetic sensor device 1. The first magnetic field $H_{11}$ and the second magnetic field $H_{12}$ in the Y-axis direction have different magnetic field strengths from each other, and the second magnetic field $H_{12}$ has a larger magnetic field strength than the first magnetic field $H_{11}$. In addition, the first magnetic field $H_{21}$ and the second magnetic field $H_{22}$ in the Z-axis direction have different magnetic field strengths from each other, and the second magnetic field $H_{22}$ has a larger magnetic field strength than the first magnetic field $H_{21}$.

Formula 12

$$\theta_1 = \mathrm{atan}\left(\frac{|S_{1-22} - S_{1-21}|}{|S_{1-12} - S_{1-11}|}\right) \quad (3)$$

Formula 13

$$\theta_2 = \mathrm{atan}\left(\frac{|S_{2-22} - S_{2-21}|}{|S_{2-12} - S_{2-11}|}\right) \quad (4)$$

Figure 14A:
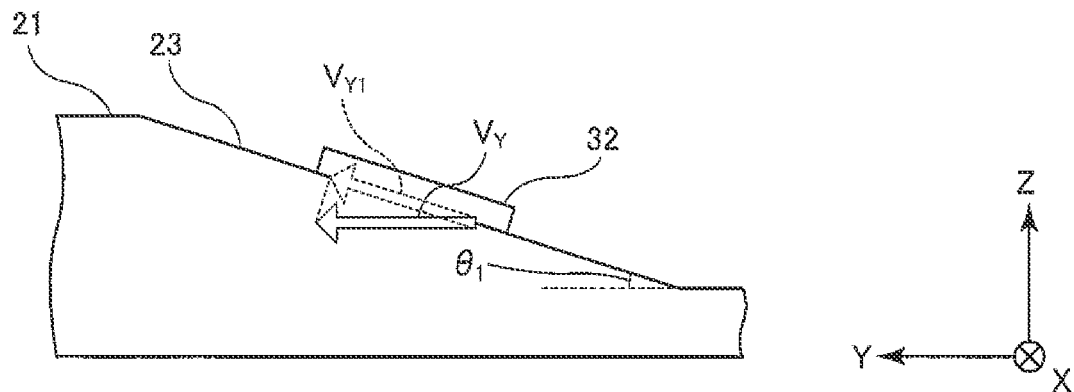
FIG. 14A is an explanatory diagram for describing the relationship between the signal output from the Y-axis magnetic sensor unit and the magnetic vector showing the magnetic field in the Y-direction corresponding thereto, when a magnetic field in the Y-direction is applied to the Y-axis magnetic sensor unit in the embodiment of the present invention.
Figure 14B:
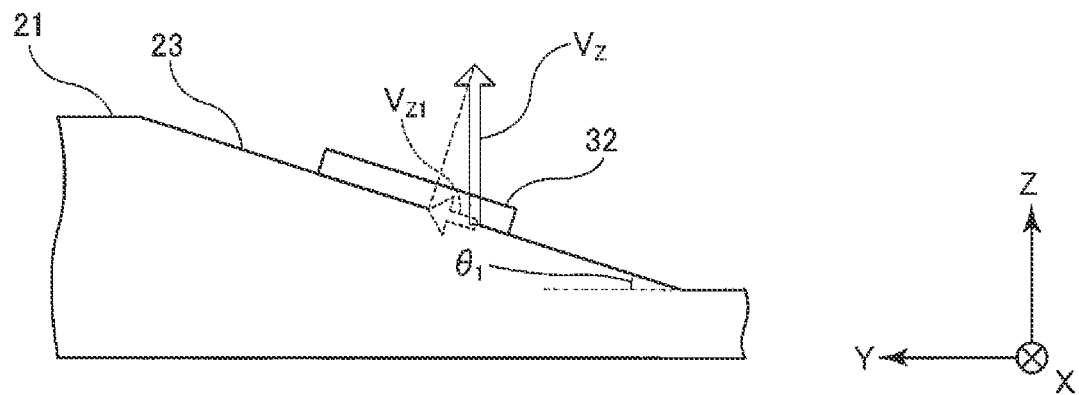
FIG. 14B is an explanatory diagram for describing the relationship between the signal output from the Y-axis magnetic sensor unit and the magnetic vector showing the magnetic field in the Z-direction corresponding thereto, when a magnetic field in the Z-direction is applied to the Y-axis magnetic sensor unit in the embodiment of the present invention.
Figure 14C:
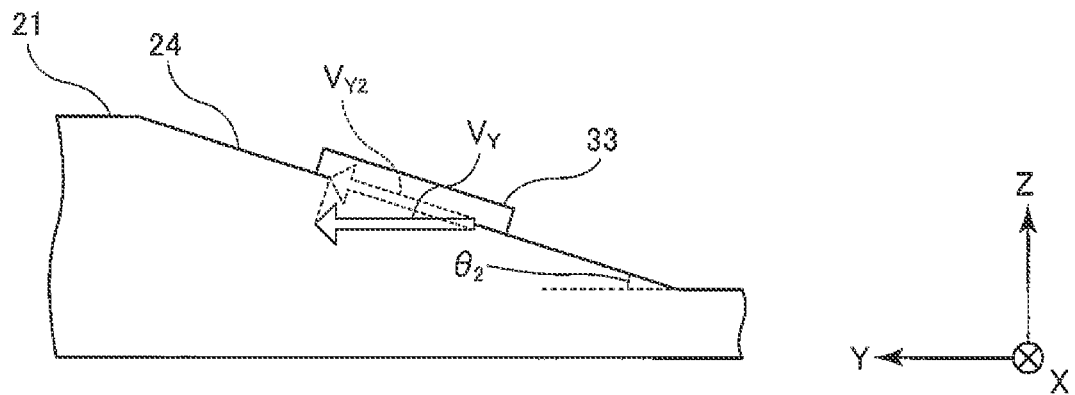
FIG. 14C is an explanatory diagram for describing the relationship between the signal output from the Z-axis magnetic sensor unit and the magnetic vector showing the magnetic field in the Y-direction corresponding thereto, when a magnetic field in the Y-direction is applied to the Z-axis magnetic sensor unit in the embodiment of the present invention.
Figure 14D:
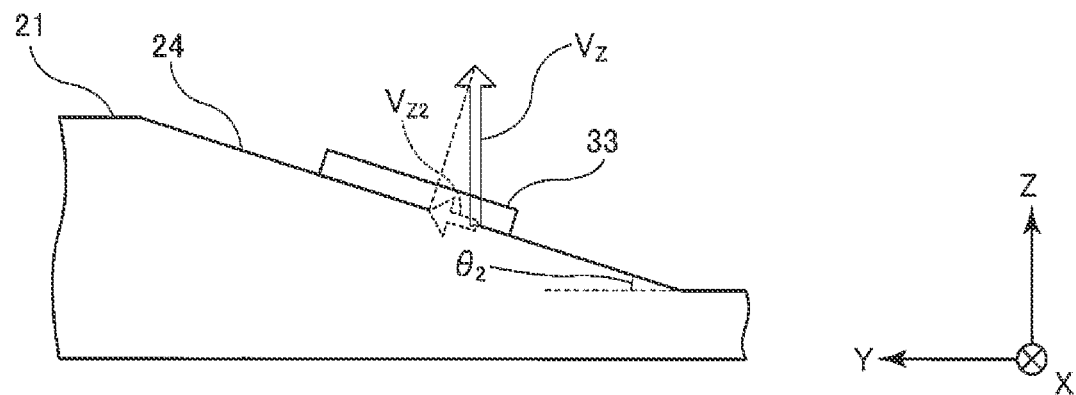
FIG. 14D is an explanatory diagram for describing the relationship between the signal output from the Z-axis magnetic sensor unit and the magnetic vector showing the magnetic field in the Z-direction corresponding thereto, when a magnetic field in the Z-direction is applied to the Z-axis magnetic sensor unit in the embodiment of the present invention.
Figure 15:
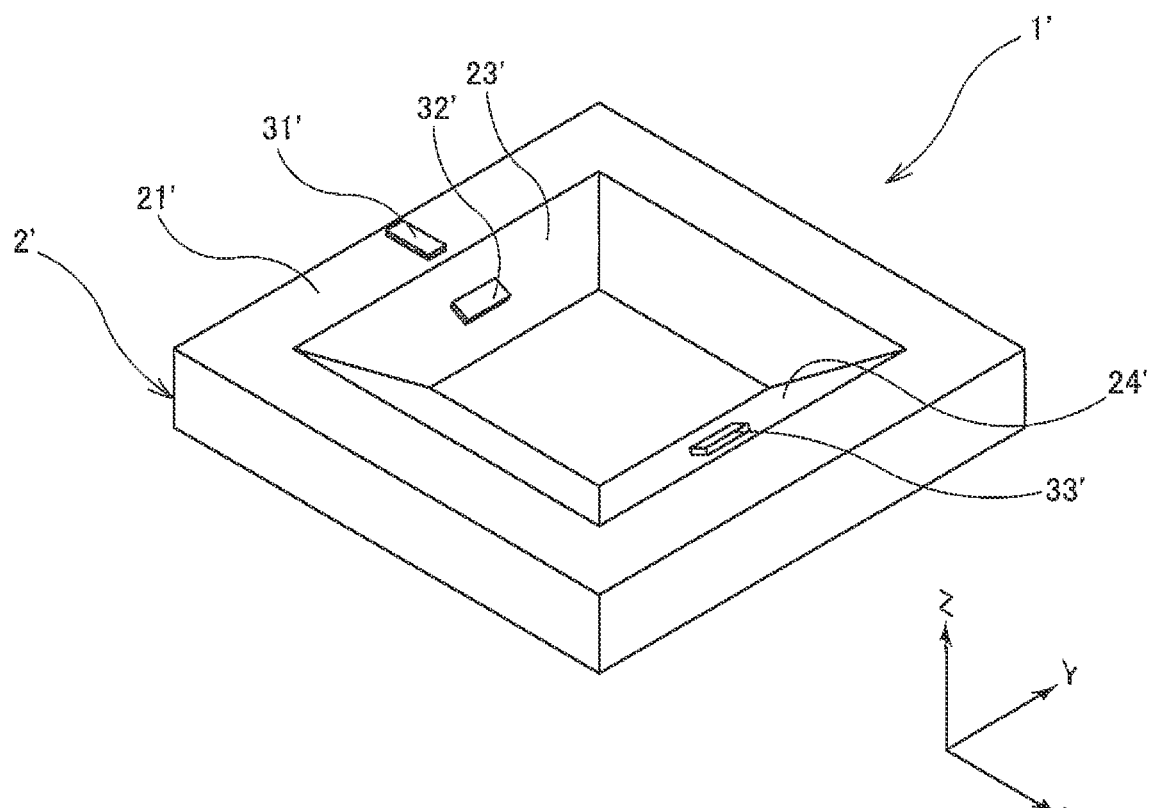
FIG. 15 is a perspective view showing the summary configuration of a conventional magnetic sensor device.

As described below, the Y-axis magnetic sensor unit 32 is provided on the first inclined surface 23, and the Z-axis magnetic sensor unit 33 is provided on the second inclined surface 24. Consequently, when a magnetic field in the Y-direction is applied to the Y-axis magnetic sensor unit 32, a first sensor signal $S_1$ is output (see FIG. 14A) in accordance with the resistance value change of the magnetoresistive effect element 5 when a magnetic field represented by the magnetic vector $V_{Y1}$, which is the magnetic vector $V_Y$ of the magnetic field in the Y-direction projected onto the first inclined surface 23, is applied to the Y-axis magnetic sensor unit 32, and when a magnetic field in the Z-direction is applied to the Y-axis magnetic sensor unit 32, and a first sensor signal $S_1$ is output (see FIG. 14B) in accordance with the resistance value change of the magnetoresistive effect element 5 when a magnetic field represented by the magnetic vector $V_{Z1}$, which is the magnetic vector $V_Z$ of the magnetic field in the Z-direction projected onto the first inclined surface 23, is applied to the Y-axis magnetic sensor unit 32. Similarly, when a magnetic field in the Y-direction is applied to the Z-axis magnetic sensor unit 33, a second sensor signal $S_2$ is output (see FIG. 14C) in accordance with the resistance value change of the magnetoresistive effect element 5 when a magnetic field represented by the magnetic vector $V_{Y2}$, which is the magnetic vector $V_Y$ of the magnetic field in the Y-direction projected onto the second inclined surface 24, is applied to the Z-axis magnetic sensor unit 33, and when a magnetic field in the Z-direction is applied to the Z-axis magnetic sensor unit 33, a second sensor signal $S_2$ is output (see FIG. 14D) in accordance with the resistance value change of the magnetoresistive effect element 5 when a magnetic field represented by the magnetic vector $V_{Z2}$, which is the magnetic vector $V_Z$ of the magnetic field in the Z-direction projected onto the second inclined surface 24, is applied to the Z-axis magnetic sensor unit 33. Consequently, in the relationship between the inclination angle $\theta_1$ of the first inclined surface 23 and the inclination angle $\theta_2$ of the second inclined surface 24, the correction coefficient F for correcting the first sensor signal $S_1$ and the second sensor signal $S_2$ to the first corrected signal $S_{C1}$ and the second corrected signal $S_{C2}$ is represented by Matrix Equation (5) below.

Formula 14

$$F = \begin{bmatrix} \cos\theta_1 & \sin\theta_1 \\ \cos\theta_2 & -\sin\theta_2 \end{bmatrix} \quad (5)$$

Furthermore, the first sensor signal $S_1$ and the second sensor signal $S_2$, and the first corrected signal $S_{C1}$ and the second corrected signal $S_{C2}$, have the relationship shown in Matrix Equation (6) below. That is, the first corrected signal $S_{C1}$ and the second corrected signal $S_{C2}$ are found by Matrix Equation (7) shown below.

Formula 15

$$\begin{bmatrix} S_1 \\ S_2 \end{bmatrix} = F \times \begin{bmatrix} S_{C1} \\ S_{C2} \end{bmatrix} \quad (6)$$

Formula 16

$$\begin{bmatrix} S_{C1} \\ S_{C2} \end{bmatrix} = F^{-1} \times \begin{bmatrix} S_1 \\ S_2 \end{bmatrix} \qquad (7)$$

In Matrix Equation (7) above, $F^{-1}$ is the inverse matrix of F.

Consequently, the corrected signal generator 42 can generate the first corrected signal $S_{C1}$ based on the above-described Equation (1), from the first sensor signal $S_1$ converted to a digital signal by the A/D converter 41 and can generate the second corrected signal $S_{C2}$ based on the above-described Equation (2), from the second sensor signal $S_2$ converted to a digital signal by the A/D converter 41.

As described above, the first corrected signal $S_{C1}$ and the second corrected signal $S_{C2}$, which are generated by the corrected signal generator 42, and the third sensor signal Sa, which is converted to a digital signal by the A/D converter 41, are input into the arithmetic processor 43. The arithmetic processor 43 accomplishes arithmetic processing using the first corrected signal $S_{C1}$, the second corrected signal $S_{C2}$ and the third sensor signal Sa.

In the joint mechanism 100 in this embodiment, when the first member 110 and the second member 120 rotate with respect to each other, the relative position of the magnetic field generator 130 with respect to the magnetic sensor device 1 is caused to change on the sphere centered on the magnetic sensor device 1 in the above-described reference coordinate system. The arithmetic processor 43 can find information related to the relative position of the magnetic field generator 130 with respect to the magnetic sensor device 1 on the above-described sphere, using the first corrected signal $S_{C1}$, the second corrected signal $S_{C2}$ and the third sensor signal $S_3$.

In this embodiment, the first sensor signal $S_1$ output from the Y-axis magnetic sensor unit 32 and the second sensor signal $S_2$ output from the Z-axis magnetic sensor unit 33 are corrected to the first corrected signal $S_{C1}$ and the second corrected signal $S_{C2}$ by the corrected signal generator 42, and the arithmetic processor 43 accomplishes arithmetic processing using the first corrected signal $S_{C1}$ and second corrected signal $S_{C2}$. Consequently, with the magnetic sensor device 1 according to this embodiment, it is possible to detect with high accuracy a magnetic field in the three axial directions of the X-axis, the Y-axis and the Z-axis.

The method of manufacturing the magnetic sensor device 1 having the above-described configuration will now be described.

The method of manufacturing the magnetic sensor device 1 according to this embodiment includes: a first process for preparing the base 2 such that the first surface 21 and the second surface 22 are oppositely positioned and the first inclined surface 23 and the second inclined surface 24 are formed on the first surface 21; a second process for forming the X-axis magnetic sensor unit 31 on the first surface 21 of the base 2, forming the Y-axis magnetic sensor unit 32 on the first inclined surface 23 and forming the Z-axis magnetic sensor unit 33 on the second inclined surface 24; a third step for finding the inclination angle $\theta_1$ of the first inclined surface 23 and the inclination angle $\theta_2$ of the second inclined surface 24; a fourth step for finding the correction coefficient F for generating the first corrected signal $S_{C1}$ and the second corrected signal $S_{C2}$; and a fifth step for causing the correction coefficient F found in the fourth step to be stored in the memory unit 44.

The first step includes a step that prepares the substrate that includes the base 2 of a semiconductor substrate such as a silicon wafer or the like, a ceramic substrate such as an AlTiC substrate, alumina substrate or the like, a resin substrate, or a glass substrate or the like; a step that forms a mask layer for forming the first inclined surface 23 and the second inclined surface 24 on one surface of the substrate (the surface corresponding to the first surface 21 of the base 2); and a step that forms the first inclined surface 23 and the second inclined surface 24 by etching the substrate via the mask layer.

In the step that forms the first inclined surface 23 and the second inclined surface 24 through etching, the etching conditions are set so that the inclination angle $\theta_1$ of the first inclined surface 23 and the inclination angle $\theta_2$ of the second inclined surface 24 become a design angle (for example, 45°), but in reality, the inclination angle $\theta_1$ of the first inclined surface 23 and the inclination angle $\theta_2$ of the second inclined surface 24 have production variations (production errors) with respect to the design angle. Consequently, taking as a premise that the inclination angle G1 of the first inclined surface 23 and the inclination angle 62 of the second inclined surface 24 are the design angles, when the first sensor signal $S_1$ and the second sensor signal $S_2$ output from the Y-axis magnetic sensor unit 32 and the Z-axis magnetic sensor unit 33, which are provided on the first inclined surface 23 and the second inclined surface 24, are corrected in accordance with the design angles of the inclination angle $\theta_1$ and the inclination angle $\theta_2$, errors arise in the signal processing results. Hence, in this embodiment, in the third step, the inclination angles 81 and 62 of the first inclined surface 23 and the second inclined surface 24 are obtained, and in the fourth step, the correction coefficient F is determined in accordance with the inclination angles 81 and 62 obtained by the third step. Using the correction coefficient F found in this manner, the first corrected signal $S_{C1}$ and the second corrected signal $S_{C2}$ are generated by correcting the first sensor signal $S_1$ and the second sensor signal $S_2$ output from the Y-axis magnetic sensor unit 32 and the Z-axis magnetic sensor unit 33, and it is possible to reduce/control errors in the signal processing results arising from variations (errors) in the inclination angles 81 and 62, by accomplishing signal processing using the first corrected signal $S_{C1}$ and the second corrected signal $S_{C2}$.

The third step includes a step for respectively applying the first magnetic field $H_{11}$ in the Y-direction and the second magnetic field $H_{12}$ in the Y-direction, along with the first magnetic field $H_{21}$ and the second magnetic field $H_{22}$ in the Z-direction, on the Y-axis magnetic sensor unit 32 provided on the first inclined surface 23 and the Z-axis magnetic sensor unit 33 provided on the second inclined surface 24; a step for finding the inclination angle $\theta_1$ of the first inclined surface 23 from Equation (3) below using the signal $S_{1-11}$ output from the Y-axis magnetic sensor unit 32 by applying the first magnetic field $H_{11}$ in the Y-direction, the signal $S_{1-12}$ output from the Y-axis magnetic sensor unit 32 by applying the second magnetic field $H_{12}$ in the Y-direction, the signal $S_{1-21}$ output from the Y-axis magnetic sensor unit 32 by applying the first magnetic field $H_{21}$ in the Z-direction, and the signal $S_{1-22}$ output from the Y-axis magnetic sensor unit 32 by applying the second magnetic field $H_{22}$ in the Z-direction; and a step for finding the inclination angle $\theta_2$ of the second inclined surface 24 from Equation (4) below using the signal $S_{2-11}$ output from the Z-axis magnetic sensor unit 33 by applying the first magnetic field $H_{11}$ in the Y-direction, the signal $S_{2-12}$ output from the Z-axis magnetic sensor unit 33 by applying the second magnetic field $H_{12}$ in the Y-direction, the signal $S_{2-21}$ output from the Z-axis magnetic sensor unit 33 by applying the first magnetic field $H_{21}$ in the Z-direction, and the signal $S_{2-22}$ output from the Z-axis magnetic sensor unit 33 by applying the second magnetic field $H_{22}$ in the Z-direction.

Formula 17

$$\theta_1 = \operatorname{atan}\left(\frac{|S_{1-22} - S_{1-21}|}{|S_{1-12} - S_{1-11}|}\right) \quad (3)$$

Formula 18

$$\theta_2 = \operatorname{atan}\left(\frac{|S_{2-22} - S_{2-21}|}{|S_{2-12} - S_{2-11}|}\right) \quad (4)$$

The first magnetic field $H_{11}$ and the second magnetic field $H_{12}$ in the Y-axis direction have different magnetic field strengths from each other, and second magnetic field $H_{12}$ has a larger magnetic field strength than the first magnetic field $H_{11}$. In addition, the first magnetic field $H_{21}$ and the second magnetic field $H_{22}$ in the Z-axis direction have different magnetic field strengths from each other, and second magnetic field $H_{22}$ has a larger magnetic field strength than the first magnetic field $H_{21}$. The magnetic field strengths of the first magnetic field $H_{11}$ and the second magnetic field $H_{12}$ should be different enough that it is possible to find the inclination angle $\theta_1$ of the first inclined surface 23, but the difference in these magnetic field strengths is not particularly limited. In addition, the magnetic field strengths of the first magnetic field $H_{21}$ and the second magnetic field $H_{22}$ should be different enough that it is possible to find the inclination angle $\theta_2$ of the second inclined surface 24, but the difference in these magnetic field strengths is not particularly limited.

The inclination angle $\theta_1$ of the first inclined surface 23 and the signals $S_{1-11}$, $S_{1-12}$, $S_{1-21}$ and $S_{1-22}$ output from the Y-axis magnetic sensor unit 32 have the relationship shown in Equation (3') below. The inclination angle $\theta_2$ of the second inclined surface 24 and the signals $S_{2-11}$, $S_{2-12}$, $S_{2-21}$ and $S_{2-22}$ output from the Z-axis magnetic sensor unit 33 have the relationship shown in Equation (4') below.

Formula 19

$$\tan\theta_1 = \frac{S_{1-22} - S_{1-21}}{S_{1-12} - S_{1-11}} \quad (3')$$

Formula 20

$$\tan\theta_2 = -\frac{S_{2-22} - S_{2-21}}{S_{2-12} - S_{2-11}} \quad (4')$$

Accordingly, the inclination angle $\theta_1$ of the first inclined surface 23 is calculated through Equation (3) above, which is an arctangent calculation of Equation (3') above, and the inclination angle $\theta_2$ of the second inclined surface 24 is calculated through Equation (4) above, which is an arctangent calculation of Equation (4') above.

In the magnetic sensor device 1 according to this embodiment, when a magnetic field in the Y-direction is applied to the Y-axis magnetic sensor unit 32, a first sensor signal $S_1$ is output (see FIG. 14A) in accordance with the resistance value change of the magnetoresistive effect elements 5 when a magnetic field represented by the magnetic vector $V_{Y1}$ that is the magnetic vector $V_Y$ of the magnetic field in the Y-direction projected onto the first inclined surface 23 is applied to the Y-axis magnetic sensor unit 32, and when a magnetic field in the Z-direction is applied to the Y-axis magnetic sensor unit 32, and a first sensor signal $S_1$ is output (see FIG. 14B) in accordance with the resistance value change of the magnetoresistive effect elements 5 when a magnetic field represented by the magnetic vector $V_{Z1}$ that is the magnetic vector $V_Z$ of the magnetic field in the Z-direction projected onto the first inclined surface 23 is applied to the Y-axis magnetic sensor unit 32. Similarly, when a magnetic field in the Y-direction is applied to the Z-axis magnetic sensor unit 33, a second sensor signal $S_2$ is output (see FIG. 14C) in accordance with the resistance value change of the magnetoresistive effect elements 5 when a magnetic field represented by the magnetic vector $V_{Y2}$ that is the magnetic vector $V_Y$ of the magnetic field in the Y-direction projected onto the second inclined surface 24 is applied to the Z-axis magnetic sensor unit 33, and when a magnetic field in the Z-direction is applied to the Z-axis magnetic sensor unit 33, a second sensor signal $S_2$ is output (see FIG. 14D) in accordance with the resistance value change of the magnetoresistive effect elements 5 when a magnetic field represented by the magnetic vector $V_{Z2}$ that is the magnetic vector $V_Z$ of the magnetic field in the Z-direction projected onto the second inclined surface 24 is applied to the Z-axis magnetic sensor unit 33. Consequently, the first sensor signal $S_1$ output from the Y-axis magnetic sensor unit 32 and the second sensor signal $S_2$ output from the Z-axis magnetic sensor unit 33 are calculated by multiplying the signal that should be output from the Y-axis magnetic sensor unit 32 in accordance with the magnetic field in the Y-direction (the first corrected signal $S_{C1}$) and the signal that should be output from the Z-axis magnetic sensor unit 33 in accordance with the magnetic field in the Z-direction (the second corrected signal $S_{C2}$), with the correction coefficient F shown in Matrix Equation (5) below in accordance with the inclination angle $\theta_1$ of the first inclined surface 23 and the inclination angle $\theta_2$ of the second inclined surface 24, which are calculated as described above. That is, the first sensor signal $S_1$ and the second sensor signal $S_2$, the inclination angle $\theta_1$ of the first inclined surface 23 and the inclination angle $\theta_2$ of the second inclined surface 24, and the first corrected signal $S_{C1}$ and the second corrected signal $S_{C2}$, can be said to have the relationships indicated in Matrix Equations (6) and (7) below.

Formula 21

$$F = \begin{bmatrix} \cos\theta_1 & \sin\theta_1 \\ \cos\theta_2 & -\sin\theta_2 \end{bmatrix} \quad (5)$$

Formula 22

$$\begin{bmatrix} S_1 \\ S_2 \end{bmatrix} = F \times \begin{bmatrix} S_{C1} \\ S_{C2} \end{bmatrix} \quad (6)$$

Formula 23

$$\begin{bmatrix} S_{C1} \\ S_{C2} \end{bmatrix} = F^{-1} \times \begin{bmatrix} S_1 \\ S_2 \end{bmatrix} \quad (7)$$

In Matrix Equation (7) above, $F^{-1}$ is the inverse matrix of the correction coefficient F.

The correction coefficient F calculated as described above is stored in the memory unit 44 in the fifth step. Through this, the magnetic sensor device 1 according to this embodiment is produced. In the magnetic sensor device 1 produced in this manner, the first sensor signal $S_1$ output from the Y-axis magnetic sensor unit 32 and the second sensor signal $S_2$ output from the Z-axis magnetic sensor unit 33 are corrected to the first corrected signal $S_{C1}$ and the second corrected signal $S_{C2}$ by Matrix Equation (7) above, using the correction coefficient F stored in the memory unit 44. The first corrected signal $S_{C1}$ and the second corrected signal $S_{C2}$ are signals that correspond to the inclination angle $\theta_1$ of the first inclined surface 23 and the inclination angle $\theta_2$ of the second inclined angle 24 found in the third step. Consequently, by accomplishing signal processing using the first corrected signal $S_{C1}$ and the second corrected signals $S_{C2}$, a magnetic field in the three axial directions (the X-axis, Y-axis and Z-axis) can be detected with high accuracy.

The embodiment described above was disclosed in order to facilitate understanding of the invention and is not limiting on the present invention. Accordingly, all elements disclosed in the above embodiment shall be construed to include all design modifications and equivalents falling within the technical scope of the present invention.

Embodiment

Below, test examples are cited to describe the present invention in further detail, but the present invention is not limited by the below test examples.

Test Example 1

In the magnetic sensor device 1 shown in FIG. 4A, the first sensor signal $S_1$ output from the Y-axis magnetic sensor unit 32 and the second sensor signal $S_2$ output from the Z-axis magnetic sensor unit 33 were obtained through simulation when a sweep magnetic field (−1 mT~1 mT) in the Y-axis direction and a sweep magnetic field (−1 mT~1 mT) in the Z-axis direction were respectively applied to the Y-axis magnetic sensor unit 32 and the Z-axis magnetic sensor unit 33, respectively, with the inclination angle $\theta_1$ of the first inclined surface 23 and the inclination angle $\theta_2$ of the second inclined surface 24 taken to be 45°. This simulation was performed 128 times while generating variations in the inclination angles $\theta_1$ and $\theta_2$ (variations within the range±3.0 deg) with true random numbers.

With an ideal magnetic sensor device, a signal corresponding to a 1 mT magnetic field would be output with respect to an applied 1 mT magnetic field. That is, the signal output for the applied magnetic field would have ideal linearity. In such an ideal magnetic sensor device, the linearity error in the signal output would be 0%. As a result of the above-described simulation, it was confirmed that through the variations in the inclination angle $\theta_1$ of the first inclined surface 23 and the inclination angle $\theta_2$ of the second inclined surface 24, the first sensor signal $S_1$ and the second sensor signal $S_2$ have a linearity error of around ±3% with respect to the first sensor signals $S_1$ and the second sensor signal $S_2$ output from the ideal magnetic sensor device.

Test Example 2

In accordance with the variations in the inclination angles $\theta_1$ and $\theta_2$ produced by genuine random numbers in the above-described Test Example 1, the first corrected signal $S_{C1}$ and the second corrected signal $S_{C2}$ were obtained through simulation by correcting the first sensor signal $S_1$ and the second sensor signal $S_2$ using above-described Equations (1) and (2). As a result, the linearity error possessed by the first corrected signal $S_{C1}$ and the second corrected signal $S_{C2}$ with respect to the first sensor signal $S_1$ and the second sensor signal $S_2$ output from the ideal magnetic sensor device was confirmed to be less than ±1%.

DESCRIPTION OF SYMBOLS

1 Magnetic sensor device
2 Base
21 First surface
22 Second surface
23 First inclined surface
24 Second inclined surface
31 X-axis magnetic sensor unit (third magnetic sensor unit)
32 Y-axis magnetic sensor unit (first magnetic sensor unit)
33 X-axis magnetic sensor unit (second magnetic sensor unit)
4 Signal processing unit
41 A/D converter
42 Corrected signal generator
43 Arithmetic processor
44 Memory unit
5 Magnetoresistive effect element (first through third magnetoresistive effect elements)
51 Free layer
53 Magnetization fixed layer

The invention claimed is:

1. A magnetic sensor device comprising:
a first surface and a second surface, which is positioned opposite to the first surface, and a first inclined surface and second inclined surface, which are inclined with respect to the first surface;
a first magnetic sensor unit for detecting magnetism in a first axial direction;
a second magnetic sensor unit for detecting magnetism in a second axial direction;
a third magnetic sensor unit for detecting magnetism in a third axial direction; and
a signal processing unit that performs signal processing on the basis of a first sensor signal $S_1$ output from the first magnetic sensor unit, a second sensor signal $S_2$ output from the second magnetic sensor unit and a third sensor signal $S_3$ output from the third magnetic sensor unit;
wherein the first axial direction is a direction orthogonal to the first surface;
the second axial direction and the third axial direction are directions orthogonal to each other on the first surface;
the first magnetic sensor unit is provided on the first inclined surface;
the second magnetic sensor unit is provided on the second inclined surface; and
the signal processing unit includes a corrected signal generation unit that generates a first corrected signal $S_{C1}$ and a second corrected signal $S_{C2}$, which are the first sensor signal $S_1$ and the second sensor signal $S_2$ corrected in accordance with the inclination angle $\theta_1$ of the first inclined surface and the inclination angle $\theta_2$ of the second inclined surface.

2. The magnetic sensor device according to claim 1, wherein the corrected signal generation unit generates the first corrected signal $S_{C1}$ by correcting the first sensor signal $S_1$ using Equation (1) below and generates the second corrected signal $S_{C2}$ by correcting the second sensor signal $S_2$ using Equation (2) below Formula 1

$$S_{C1} = \frac{\sin\theta_2 \cdot S_1 + \sin\theta_1 \cdot S_2}{\sin(\theta_1 + \theta_2)} \quad (1)$$

Formula 2

$$S_{C2} = \frac{\cos\theta_2 \cdot S_1 + \cos\theta_1 \cdot S_2}{\sin(\theta_1 + \theta_2)} \quad (2)$$

wherein, in Equation (1) and Equation (2) above, $S_{C1}$ indicates the first corrected signal, $S_{C2}$ indicates the second corrected signal, $S_1$ indicates the first sensor signal, $S_2$ indicates the second sensor signal, $\theta_1$ indicates the inclination angle of the first inclined surface, and $\theta_2$ indicates the inclination angle of the second inclined surface.

3. The magnetic sensor device according to claim 1, wherein:

the inclination angle $\theta_1$ of the first inclined surface is an angle calculated from Equation (3) below using a signal $S_{1-11}$ output from the first magnetic sensor unit when a first magnetic field $H_{11}$ in the first axial direction is applied to the magnetic sensor device, a signal $S_{1-12}$ output from the first magnetic sensor unit when a second magnetic field $H_{12}$ in the first axial direction is applied to the magnetic sensor device, a signal $S_{1-21}$ output from the first magnetic sensor unit when a first magnetic field $H_{21}$ in the second axial direction is applied to the magnetic sensor device, and a signal $S_{1-22}$ output from the first magnetic sensor unit when a second magnetic field $H_{22}$ in the second axial direction is applied to the magnetic sensor device;

the inclination angle $\theta_2$ of the second inclined surface is an angle calculated from Equation (4) below using a signal $S_{2-11}$ output from the second magnetic sensor unit when the first magnetic field $H_{11}$ in the first axial direction is applied to the magnetic sensor device, a signal $S_{2-12}$ output from the second magnetic sensor unit when the second magnetic field $H_{12}$ in the first axial direction is applied to the magnetic sensor device, a signal $S_{2-21}$ output from the second magnetic sensor unit when the first magnetic field $H_{21}$ in the second axial direction is applied to the magnetic sensor device, and a signal $S_{2-22}$ output from the second magnetic sensor unit when the second magnetic field $H_{22}$ in the second axial direction is applied to the magnetic sensor device;

the first magnetic field $H_{11}$ in the first axial direction and the second magnetic field $H_{12}$ in the first axial direction have different magnetic field strengths from each other; and the first magnetic field $H_{21}$ in the second axial direction and the second magnetic field $H_{22}$ in the second axial direction have different magnetic field strengths from each other Formula 3

$$\theta_1 = a\tan\left(\frac{|S_{1-22} - S_{1-21}|}{|S_{1-12} - S_{1-11}|}\right) \quad (3)$$

Formula 4

$$\theta_2 = a\tan\left(\frac{|S_{2-22} - S_{2-21}|}{|S_{2-12} - S_{2-11}|}\right) \quad (4)$$

4. The magnetic sensor device according to claim 1, wherein:

the signal processing unit further includes a memory unit that stores a correction coefficient F indicated in a Matrix Equation (5) below for generating the first corrected signal $S_{C1}$ and the second corrected signal $S_{C2}$ by correcting the first sensor signal $S_1$ and the second sensor signal $S_2$; and the corrected signal generation unit generates the first corrected signal $S_{C1}$ and the second corrected signal $S_{C2}$ by correcting the first sensor signal $S_1$ and the second sensor signal $S_2$ using Matrix Equation (7) below:

Formula 5

$$F = \begin{bmatrix} \cos\theta_1 & \sin\theta_1 \\ \cos\theta_2 & -\sin\theta_2 \end{bmatrix} \quad (5)$$

Formula 6

$$\begin{bmatrix} S_{C1} \\ S_{C2} \end{bmatrix} = F^{-1} \times \begin{bmatrix} S_1 \\ S_2 \end{bmatrix} \quad (7)$$

wherein, in Matrix Equation (5) above, F indicates the correction coefficient, $\theta_1$ indicates the inclination angle of the first inclined surface, and $\theta_2$ indicates the inclination angle of the second inclined surface, and in Matrix Equation (7) above, $S_{C1}$ indicates the first corrected signal, $S_{C2}$ indicates the second corrected signal, $S_1$ indicates the first sensor signal, $S_2$ indicates the second sensor signal, and $F^{-1}$ indicates the inverse matrix of F.

5. The magnetic sensor device according to claim 1, wherein:

the first magnetic sensor unit includes a first magnetoresistive effect element;

the second magnetic sensor unit includes a second magnetoresistive effect element: and the third magnetic sensor unit includes a third magnetoresistive effect element.

6. The magnetic sensor device according to claim 5, wherein the first through third magnetoresistive effect elements are GMR elements or TMR elements.

7. The magnetic sensor device according to claim 1, further comprising:

a base having a first surface, a second surface, a first inclined surface and a second inclined surface; and a sealing part that integrally seals the base, the first through third magnetic sensor units and the signal processing unit.

8. A rotational operation mechanism comprising:

a first member and a second member that rotate relative to each other; and the magnetic sensor device according to claim 1, wherein the magnetic sensor device is provided in the first member to be integrally rotatable with the first member.

9. The rotational operation mechanism according to claim 8, further comprising a magnetic field generation unit, wherein the magnetic field generation unit is provided in the second member to be integrally rotatable with the second member.

10. A method of manufacturing a magnetic sensor device, wherein the magnetic sensor device comprises a base having a first surface and a second surface, which is positioned on the side opposite the first surface, and a first inclined surface and second inclined surface, which are inclined with respect to the first surface; a first magnetic sensor unit for detecting magnetism in a first axial direction; a second magnetic sensor unit for detecting magnetism in a second axial direction; a third magnetic sensor unit for detecting magnetism in a third axial direction; and a signal processing unit that performs signal processing on the basis of a first sensor signal $S_1$ output from the first magnetic sensor unit, a second sensor signal $S_2$ output from the second magnetic sensor unit, and a third sensor signal $S_3$ output from the third magnetic sensor unit, the first axial direction is a direction orthogonal to the first surface, and the second axial direction and the third axial direction are directions orthogonal to each other on the first surface, the first magnetic sensor unit is provided on the first inclined surface, and the second magnetic sensor unit is provided on the second inclined surface, the signal processing unit includes a corrected signal generation unit that generates a first corrected signal $S_{C1}$ and a second corrected signal $S_{C2}$ in which the first sensor signal $S_1$ and the second sensor signal $S_2$ are corrected in accordance with the inclination angle $\theta_1$ of the first inclined surface and the inclination angle $\theta_2$ of the second inclined surface, the method of manufacturing the magnetic sensor device includes:

a first step for preparing the base;

a second step for respectively providing the first magnetic sensor unit and the second magnetic sensor unit on the first inclined surface and the second inclined surface, respectively, of the base;

a third step for obtaining the inclination angle $\theta_1$ of the first inclined surface and the inclination angle $\theta_2$ of the second inclined surface; and a fourth step for calculating the correction coefficient for generating a first corrected signal $S_{C1}$ and a second corrected signal $S_{C2}$, in which are the first sensor signal $S_1$ and the second sensor signal $S_2$ corrected in accordance with the inclination angle $\theta_1$ of the first inclined surface and the inclination angle $\theta_2$ of the second inclined surface.

11. The method of manufacturing a magnetic sensor device according to claim 10, wherein in the fourth step, the correction coefficient is found using a Matrix Equation (5) below:

Formula 7
$$F = \begin{bmatrix} \cos\theta_1 & \sin\theta_1 \\ \cos\theta_2 & -\sin\theta_2 \end{bmatrix} \quad (5)$$

wherein in Matrix Equation (5) above, F indicates the correction coefficient.

12. The method of manufacturing a magnetic sensor device according to claim 10, wherein:

the signal processing unit further includes a memory unit that stores the correction coefficient; and the method of manufacturing the magnetic sensor device further includes a fifth step of storing the correction coefficient calculated in the fourth step tin the memory unit.

13. The method of manufacturing a magnetic sensor device according to claim 10, wherein:

the third step includes:

a step for applying a first magnetic field $H_{11}$ and a second magnetic field $H_{12}$ in the first axial direction and for applying a first magnetic field $H_{21}$ and a second magnetic field $H_{22}$ in the second axial direction, respectively, to the first magnetic sensor unit provided on the first inclined surface in the second step;

a step for applying the first magnetic field $H_{11}$ and the second magnetic field $H_{12}$ in the first axial direction and for applying the first magnetic field $H_{21}$ and the second magnetic field $H_{22}$ in the second axial direction, respectively, to the second magnetic sensor unit provided on the second inclined surface in the second step;

a step for calculating the inclination angle $\theta_1$ of the first inclined surface through Equation (3) below, using a signal $S_{1-11}$ output from the first magnetic sensor unit by applying the first magnetic field $H_{11}$ in the first axial direction, a signal $S_{1-12}$ output from the first magnetic sensor unit by applying the second magnetic field $H_{12}$ in the first axial direction, a signal $S_{1-21}$ output from the first magnetic sensor unit by applying the first magnetic field $H_{21}$ in the second axial direction, and a signal $S_{1-22}$ output from the first magnetic sensor unit by applying the second magnetic field $H_{22}$ in the second axial direction; and a step for calculating the inclination angle $\theta_2$ of the second inclined surface through Equation (4) below, using a signal $S_{2-11}$ output from the second magnetic sensor unit by applying the first magnetic field $H_{11}$ in the first axial direction, a signal $S_{2-12}$ output from the second magnetic sensor unit by applying the second magnetic field $H_{12}$ in the first axial direction, a signal $S_{2-21}$ output from the second magnetic sensor unit by applying the first magnetic field $H_{21}$ in the second axial direction, and a signal $S_{2-22}$ output from the second magnetic sensor unit by applying the second magnetic field $H_{22}$ in the second axial direction;

wherein the first magnetic field $H_{11}$ in the first axial direction and the second magnetic field $H_{12}$ in the first axial direction have magnetic field strengths differing from each other; and the first magnetic field $H_{21}$ in the second axial direction and the second magnetic field $H_{22}$ in the second axial direction have magnetic field strengths differing from each other Formula 8
$$\theta_1 = a\tan\left(\frac{|S_{1-22} - S_{1-21}|}{|S_{1-12} - S_{1-11}|}\right) \quad (3)$$

Formula 9
$$\theta_2 = a\tan\left(\frac{|S_{2-22} - S_{2-21}|}{|S_{2-12} - S_{2-11}|}\right). \quad (4)$$

* * * * *